United States Patent
Fujisawa et al.

(10) Patent No.: US 11,591,715 B2
(45) Date of Patent: Feb. 28, 2023

(54) GAN SINGLE CRYSTAL AND METHOD FOR MANUFACTURING GAN SINGLE CRYSTAL

(71) Applicant: MITSUBISHI CHEMICAL CORPORATION, Tokyo (JP)

(72) Inventors: Hideo Fujisawa, Tokyo (JP); Yutaka Mikawa, Tokyo (JP); Shinichiro Kawabata, Tokyo (JP); Hideo Namita, Tokyo (JP); Tae Mochizuki, Tokyo (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 17/223,073

(22) Filed: Apr. 6, 2021

(65) Prior Publication Data

US 2021/0230770 A1 Jul. 29, 2021

Related U.S. Application Data

(63) Continuation of application No. 16/196,620, filed on Nov. 20, 2018, now Pat. No. 11,001,940, which is a (Continued)

(30) Foreign Application Priority Data

Feb. 6, 2015 (JP) ................................. 2015-022362
May 15, 2015 (JP) ................................. 2015-100122
Oct. 30, 2015 (JP) ................................. 2015-214505

(51) Int. Cl.
*C30B 25/18* (2006.01)
*C30B 29/40* (2006.01)
(Continued)

(52) U.S. Cl.
CPC ............. *C30B 29/406* (2013.01); *C30B 7/10* (2013.01); *C30B 7/105* (2013.01); *C30B 25/18* (2013.01);
(Continued)

(58) Field of Classification Search
CPC ......... C30B 29/406; C30B 7/10; C30B 7/105; C30B 25/18; C30B 29/32; H01L 21/0242; H01L 21/0254
See application file for complete search history.

(56) References Cited

U.S. PATENT DOCUMENTS 6,468,347 B1 10/2002 Motoki et al.
9,048,169 B2 6/2015 Arena
(Continued)

FOREIGN PATENT DOCUMENTS

EP 2267197 A1 12/2010
JP 2001102307 A 4/2001
(Continued)

OTHER PUBLICATIONS

Office Action dated Jul. 1, 2021 in European Patent Application No. 16746721.6, 6 pages.
(Continued)

*Primary Examiner* — Robert M Kunemund
(74) *Attorney, Agent, or Firm* — Element IP, PLC

(57) ABSTRACT

A GaN single crystal having a gallium polar surface which is a main surface on one side and a nitrogen polar surface which is a main surface on the opposite side, wherein on the gallium polar surface is found at least one square area, an outer periphery of which is constituted by four sides of 2 mm or more in length, and, when the at least one square area is divided into a plurality of sub-areas each of which is a 100 μm×100 μm square, pit-free areas account for 80% or more of the plurality of sub-areas.

13 Claims, 17 Drawing Sheets

Related U.S. Application Data continuation of application No. 15/663,276, filed on Jul. 28, 2017, now Pat. No. 10,301,743, which is a continuation of application No. PCT/JP2016/053491, filed on Feb. 5, 2016.

(51) Int. Cl.
  *C30B 7/10* (2006.01)
  *C30B 29/38* (2006.01)
  *H01L 21/02* (2006.01)

(52) U.S. Cl.
  CPC .......... *C30B 29/38* (2013.01); *H01L 21/0242* (2013.01); *H01L 21/0254* (2013.01)

(56) References Cited

U.S. PATENT DOCUMENTS

| | | |
|---|---|---|
| 9,518,340 B2 | 12/2016 | Hashimoto |
| 9,589,792 B2 | 3/2017 | Jiang |
| 9,650,723 B1 | 5/2017 | D'Evelyn |
| 10,301,743 B2 | 5/2019 | Fujisawa |
| 2004/0183090 A1 | 9/2004 | Kitaoka et al. |
| 2009/0127664 A1 | 5/2009 | Okahisa et al. |
| 2011/0250714 A1 | 10/2011 | Sugawara |
| 2012/0068184 A1 | 3/2012 | Craven |
| 2012/0068192 A1 | 3/2012 | Kim |
| 2013/0056821 A1* | 3/2013 | Chang .............. H01L 29/41766 257/330 |
| 2013/0193558 A1 | 8/2013 | Ju et al. |
| 2013/0209271 A1* | 8/2013 | Hada .................. F01D 5/18 416/97 R |
| 2014/0065360 A1 | 3/2014 | D'Evelyn et al. |
| 2014/0110722 A1 | 4/2014 | Kub |
| 2014/0147650 A1* | 5/2014 | Jiang ................. H01L 21/02642 428/220 |
| 2014/0162441 A1* | 6/2014 | Preble ................. H01L 21/0242 438/488 |
| 2015/0361581 A1* | 12/2015 | Carlson ............ H01L 21/67115 118/641 |
| 2015/0361587 A1 | 12/2015 | Mikawa et al. |

FOREIGN PATENT DOCUMENTS

| | | |
|---|---|---|
| JP | 2005012171 A | 1/2005 |
| JP | 2009126723 A | 6/2009 |
| JP | 2011195388 A | 10/2011 |
| JP | 2013056821 A | 3/2013 |
| JP | 2013209271 A | 10/2013 |
| JP | 2013544739 A | 12/2013 |
| JP | 2014055091 A | 3/2014 |
| JP | 2014111527 A | 6/2014 |
| JP | 2014152076 A | 8/2014 |
| JP | 2014208571 A | 11/2014 |
| WO | WO-2014129544 A1 | 8/2014 |

OTHER PUBLICATIONS

Office Action dated Sep. 7, 2021 in Japanese Patent Application No. 2020-128515 (with English machine translation), 5 pages.
European Office Action dated May 25, 2020 for the corresponding European Patent Application No. 16746721.6.
Extended European Search Report dated Dec. 13, 2017 for the corresponding European Patent Application No. 16746721.6.
International Search Report dated May 10, 2016 for the corresponding PCT Application No. PCT/JP2016/053491.
Japanese Office Action dated Nov. 12, 2019 for the corresponding Japanese Patent Application No. 2016-573435 (with English translation).
M.P. D'Evelyn et al., "Ammonothermal Bulk GaN Substrates for Power Electronics", ECS Transactions, 2013, pp. 287-294, vol. 58, No. 4.
Notification of Transmittal of Translation of the International Preliminary Report on Patentability dated Aug. 17, 2017 for the corresponding PCT Application No. PCT/JP2016/053491.
Office Action dated Aug. 23, 2018 for the parent U.S. Appl. No. 15/663,276.
Office Action dated May 3, 2018 for the parent U.S. Appl. No. 15/663,276.
Proceedings of SPIE, 2015, pp. 936301-1 to 936301-14, vol. 9363.
Quanxi Bao et al., "Ammonothermal Crystal Growth of GaN Using an NH4F Mineralizer", Crystal Growth & Design, Aug. 23, 2013, pp. 4158-4161, vol. 13.
R. Dwilinski et al., "Excellent crystallinity of truly bulk ammonothermal GaN", Journal of Crystal Growth, Jun. 18, 2008, pp. 3911-3916, vol. 310.
R.Dwilinski et al., "Recent achievements in AMMONO-bulk method", Journal of Crystal Growth, Apr. 9, 2010, pp. 2499-2502, vol. 312.
Wenkan Jiang et al., "Highly transparent ammonothermal bulk GaN substrates", Journal of Crystal Growth, Jun. 9, 2014, pp. 18-21, vol. 403.
Yutaka Mikawa, et al., Ammonothermal Growth of Polar and Non-polar bulk GaN Crystal, Proceedings of SPIE, 2015, pp. 936302-1 to 936302-6, vol. 9363.

* cited by examiner

GAN SINGLE CRYSTAL AND METHOD FOR MANUFACTURING GAN SINGLE CRYSTAL

CROSS-REFERENCE TO RELATED APPLICATION

This application is a Continuation of U.S. patent application Ser. No. 16/196,620, filed Nov. 20, 2018 now U.S. Pat. No. 11,001,940, which is a Continuation of U.S. patent application Ser. No. 15/663,276, filed Jul. 28, 2017 now U.S. Pat. No. 10,301,743, which is a continuation of International Application No. PCT/JP2016/053491, filed on Feb. 5, 2016, which designated the U.S., and claims priority from Japanese Patent Application No. 2015-022362 which was filed on Feb. 6, 2015, Japanese Patent Application No. 2015-100122 which was filed on May 15, 2015 and Japanese Patent Application No. 2015-214505 which was filed on Oct. 30, 2015, the entire contents of which are incorporated herein by reference.

TECHNICAL FIELD

The present invention mainly relates to a GaN single crystal and a method for producing a GaN single crystal.

BACKGROUND ART

GaN (gallium nitride) is one of group III-V compound semiconductors and has a wurtzite crystal structure belonging to hexagonal crystal systems.

In recent years, single crystal GaN wafers have attracted attention as semiconductor wafers for nitride semiconductor devices.

Nitride semiconductors are also referred to as, for example, nitride-based group III-V compound semiconductors, group III nitride compound semiconductors, and GaN-based semiconductors, and include, in addition to GaN, a compound in which a part or all of gallium in GaN is substituted with another group 13 element (such as B, Al, and In).

One of highly useful single crystal GaN wafers is a C-plane GaN wafer. The C-plane GaN wafer is a single crystal GaN wafer having a main surface parallel to or slightly tilted from the C-plane. The C-plane GaN wafer has a gallium polar surface which is a main surface on the [0001] side and a nitrogen polar surface which is a main surface on the [000-1] side. So far, it is mainly the gallium polar surface that is used to form nitride semiconductor devices.

Preferable methods for growing GaN single crystals used for the C-plane GaN wafer include an ammonothermal method. In the ammonothermal method, GaN dissolved in ammonia in a supercritical or subcritical state is precipitated as a single crystal on a seed.

Non-Patent Document 1 reported that a C-plane GaN wafer was produced from a GaN single crystal grown by an ammonothermal method, and that a dislocation-free area of 1 $mm^2$ was observed on the surface of the C-plane GaN wafer.

Non-Patent Document 2 reported that a C-plane GaN wafer of 2 inches in diameter was fabricated from a GaN single crystal grown by an ammonothermal method.

Patent Document 1 described that a pattern mask having linear openings was formed on a main surface of a C-plane GaN wafer used as a seed and a GaN layer was grown through the openings by an ammonothermal method. The extending direction of the linear openings was the m-axis direction <10-10> or the a-axis direction <11-20>. According to the description, GaN crystals grown from the inside of the linear openings of the pattern mask were further grown in a lateral direction on the pattern mask, and coalesced with each other to form a single layer.

Patent Document 2 described that a pattern mask having linear openings was formed on a nitrogen polar surface of a C-plane GaN wafer used as a seed and GaN single crystals were grown through the linear openings by an ammonothermal method. According to the description, the GaN crystal grown through each of the linear openings was further grown by as long as 10 mm in the [000-1] direction without coalescence.

Non-Patent Document 3 reported growth rates of GaN crystals obtained when various ammonium halide mineralizers were used in an ammonothermal method.

PRIOR ART DOCUMENT

Patent Document

Patent Document 1: JP-A-2014-111527
Patent Document 2: JP-A-2014-208571

Non-Patent Literature

Non-Patent Document 1: R. Dwilinski, R. Doradzinski, J. Garczynski, L. P. Sierzputowski, A. Puchalski, Y. Kanbara, K. Yagi, H. Minakuchi, H. Hayashi, "Excellent crystallinity of truly bulk ammonothermal GaN", Journal of Crystal Growth 310 (2008) 3911-3916.
Non-Patent Document 2: R. Dwilinski, R. Doradzinski, J. Garczynski, L. Sierzputowski, R. Kucharski, M. Zajac, M. Rudzinski, R. Kudrawiec, J. Serafnczuk, W. Strupinski, "Recent achievements in AMMONO-bulk method", Journal of Crystal Growth 312 (2010) 2499-2502.
Non-Patent Document 3: Quanxi Bao, Makoto Saito, Kouji Hazu, Kentaro Furusawa, Yuji Kagamitani, Rinzo Kayano, Daisuke Tomida, Kun Qiao, Tohru Ishiguro, Chiaki Yokoyama, Shigefusa F. Chichibu, "Ammonothermal Crystal Growth of GaN Using an $NH_4F$ Mineralizer", Crystal Growth & Design 4158-4161 (2013) 13.

SUMMARY OF THE INVENTION

Problem to be Solved by Invention

A main object of the present invention is to provide a novel GaN single crystal having an improved quality and a novel production method of GaN single crystal for producing a GaN single crystal having an improved quality.

Means for Solving the Problem

According to the present invention, a GaN single crystal described below is provided.

[1] A GaN single crystal having a gallium polar surface which is a main surface on one side and a nitrogen polar surface which is a main surface on the opposite side, wherein on the gallium polar surface is found at least one square area, an outer periphery of which is constituted by four sides of 2 mm or more in length, and, when the at least one square area is divided into a plurality of sub-areas each of which is a 100 μm×100 μm square, pit-free areas account for 80% or more of the plurality of sub-areas.

[2] The GaN single crystal according to [1], wherein the pit-free areas account for 85% or more of the plurality of sub-areas.

[3] The GaN single crystal according to [1], wherein the pit-free areas account for 90% or more of the plurality of sub-areas.

[4] The GaN single crystal according to any one of [1] to [3], wherein in a sub-area having a highest EPD among the plurality of sub-areas, the EPD is less than $1\times10^6$ cm$^{-2}$.

[5] The GaN single crystal according to any one of [1] to [4], wherein an average value of EPDs across the plurality of sub-areas is less than $1\times10^4$ cm$^{-2}$.

[6] The GaN single crystal according to [3], wherein in a sub-area having the highest EPD among the plurality of sub-areas, the EPD is less than $2\times10^3$ cm$^{-2}$.

[7] The GaN single crystal according to [3] or [6], wherein the average value of EPDs across the plurality of sub-areas is less than $3\times10^3$ cm$^{-2}$.

[8] The GaN single crystal according to [3], [6], or [7], wherein the length of each of the four sides constituting the outer periphery of the at least one square area is 3.5 mm or less.

[9] The GaN single crystal according to any one of [1] to [8], wherein at least one square pit-free area of 1.3 mm×1.3 mm is found on the gallium polar surface.

[10] The GaN single crystal according to any one of [1] to [9], wherein each of the gallium polar surface and the nitrogen polar surface has a size encompassing a 10 mm×10 mm square, and an anomalous transmission image of a square area of 10 mm×10 mm is obtainable from the crystal by X-ray topography.

[11] A GaN single crystal having a gallium polar surface which is a main surface on one side and a nitrogen polar surface which is a main surface on the opposite side, wherein at least one square pit-free area of 1.3 mm×1.3 mm is found on the gallium polar surface.

[12] A GaN single crystal having a gallium polar surface which is a main surface on one side and a nitrogen polar surface which is a main surface on the opposite side, wherein each of the gallium polar surface and the nitrogen polar surface has a size encompassing a 10 mm×10 mm square, and an anomalous transmission image is obtainable from the crystal by X-ray topography.

[13] A GaN single crystal having a gallium polar surface which is a main surface on one side and a nitrogen polar surface which is a main surface on the opposite side, wherein each of the gallium polar surface and the nitrogen polar surface has a size encompassing a square of 10 mm×10 mm, and an anomalous transmission image of a square area of 10 mm×10 mm is obtainable from the crystal by X-ray topography.

[14] A GaN single crystal having a gallium polar surface which is a main surface on one side and a nitrogen polar surface which is a main surface on the opposite side, wherein at least one first line segment which is a virtual line segment can be drawn on at least one of the gallium polar surface and the nitrogen polar surface, the first line segment being defined by the following definition (A):

(A) the first line segment is a line segment having a length $L_1$ (provided that the length $L_1$ is 20 mm or more, preferably 30 mm or more, more preferably 40 mm or more, more preferably 50 mm or more, and more preferably 60 mm or more), wherein, when XRC-FWHMs of the (002) reflection are measured at 0.2 mm intervals on the first line segment with the X-ray incidence plane parallel to the first line segment in each ω scan, the measured values fall below 50 arcsec at 90% or more of all the measurement points.

[15] The GaN single crystal according to [14], wherein the first line segment further includes one or more characteristics selected from the following (A1) to (A3):

(A1) when XRC-FWHMs of the (002) reflection are measured at 0.2 mm intervals on the first line segment with the X-ray incidence plane parallel to the first line segment in each ω scan, the measured values fall below 50 arcsec at 95% or more, preferably 98% or more, more preferably 99% or more, more preferably 100% of all the measurement points;

(A2) when XRC-FWHMs of the (002) reflection are measured at 0.2 mm intervals on the first line segment with the X-ray incidence plane parallel to the first line segment in each ω scan, the measured values fall below 40 arcsec at 90% or more, preferably 95% or more, more preferably 98% or more of all the measurement points; and (A3) when XRC-FWHMs of the (002) reflection are measured at 0.2 mm intervals on the first line segment with the X-ray incidence plane parallel to the first line segment in each ω scan, the measured values fall below 30 arcsec at 90% or more, preferably 95% or more, more preferably 98% or more of all the measurement points.

[16] The GaN single crystal according to [14] or [15], wherein at least one second line segment which is a virtual line segment can be drawn on the gallium polar surface or the nitrogen polar surface on which the first line segment can be drawn, the second line segment being defined by the following definition (B):

(B) the second line segment is a line segment having a length $L_2$ (provided that the length $L_2$ is 20 mm or more, preferably 30 mm or more, more preferably 40 mm or more, more preferably 50 mm or more, more preferably 60 mm or more) and being orthogonal to at least one of the first line segment, wherein, when XRC-FWHMs of the (002) reflection are measured at 0.2 mm intervals on the second line segment with the X-ray incidence plane parallel to the second line segment in each ω scan, the measured values fall below 50 arcsec at 90% or more of all the measurement points.

[17] The GaN single crystal according to [16], wherein the second line segment further includes one or more characteristics selected from the following (B1) to (B3):

(B1) when XRC-FWHMs of the (002) reflection are measured at 0.2 mm intervals on the second line segment with the X-ray incidence plane parallel to the second line segment in each ω scan, the measured values fall below 50 arcsec at 95% or more, preferably 98% or more, more preferably 99% or more, more preferably 100% at all the measurement points;

(B2) when XRC-FWHMs of the (002) reflection are measured at 0.2 mm intervals on the second line segment with the X-ray incidence plane parallel to the second line segment in each ω scan, the measured values fall below 40 arcsec at 90% or more, preferably 95% or more, more preferably 98% or more of all the measurement points; and (B3) when XRC-FWHMs of the (002) reflection are measured at 0.2 mm intervals on the second line segment with the X-ray incidence plane parallel to the second line segment in each ω scan, the measured values fall below 30 arcsec at 90% or more, preferably 95% or more, more preferably 98% or more of all the measurement points.

[18] A GaN single crystal having a gallium polar surface which is a main surface on one side and a nitrogen polar surface which is a main surface on the opposite side, wherein at least one third line segment which is a virtual line segment can be drawn on at least one of the gallium polar surface and the nitrogen polar surface, the third line segment being defined by the following definition (C):

(C) the third line segment is a line segment having a length $L_3$ (provided that the length $L_3$ is 20 mm or more, preferably 30 mm or more, more preferably 40 mm or more, more preferably 50 mm or more, more preferably 60 mm or more), wherein, when XRC-FWHMs of the (004) reflection are measured at 1 mm intervals on the third line segment with the X-ray incidence plane parallel to the third line segment in each ω scan, an average of the measured values across all the measurement points falls below 20 arcsec.

[19] The GaN single crystal according to [18], wherein the third line segment further includes one or more characteristics selected from the following (C1) and (C2):

(C1) when XRC-FWHMs of the (004) reflection are measured at 1 mm intervals on the third line segment with the X-ray incidence plane parallel to the third line segment in each ω scan, an average of the measured values across all the measurement points falls below 15 arcsec; and (C2) when XRC-FWHMs of the (004) reflection are measured at 1 mm intervals on the third line segment with the X-ray incidence plane parallel to the third line segment in each ω scan, a standard deviation of the measured values across all the measurement points is 5 arcsec or less.

[20] The GaN single crystal according to [18] or [19], wherein at least one fourth line segment which is a virtual line segment can be drawn on the gallium polar surface or the nitrogen polar surface on which the third line segment can be drawn, the fourth line segment being defined by the following definition (D):

(D) the fourth line segment is a line segment having a length $L_4$ (provided that the length $L_4$ is 20 mm or more, preferably 30 mm or more, more preferably 40 mm or more, more preferably 50 mm or more) and being orthogonal to at least one of the third line segment, wherein, when XRC-FWHMs of the (004) reflection are measured at 1 mm intervals on the fourth line segment with the X-ray incidence plane parallel to the fourth line segment in each ω scan, an average of the measured values across all the measurement points falls below 20 arcsec.

[21] The GaN single crystal according to [20], wherein the fourth line segment further includes one or more characteristics selected from the following (D1) and (D2):

(D1) when XRC-FWHMs of the (004) reflection are measured at 1 mm intervals on the fourth line segment with the X-ray incidence plane parallel to the fourth line segment in each ω scan, an average of the measured values across all the measurement points falls below 15 arcsec; and (D2) when XRC-FWHMs of the (004) reflection are measured at 1 mm intervals on the fourth line segment with the X-ray incidence plane parallel to the fourth line segment in each ω scan, a standard deviation of the measured values across all the measurement points is 5 arcsec or less.

[22] The GaN single crystal according to any one of [1] to [21], which comprises a linear dislocation array on the gallium polar surface.

[23] The GaN single crystal according to [22], wherein an extending direction of the linear dislocation array forms an angle within a range of 12°±5° with one of intersection lines between the gallium polar surface and the M-planes.

[24] A GaN single crystal having a gallium polar surface which is a main surface on one side and a nitrogen polar surface which is a main surface on the opposite side, the single crystal comprising a linear dislocation array on the gallium polar surface, wherein an extending direction of the linear dislocation array forms an angle within a range of 12°±5° with one of intersection lines between the gallium polar surface and the M-planes.

[25] The GaN single crystal according to any one of [22] to [24], wherein the number of dislocations present in a 100 μm×100 μm square area which entirely overlaps with the linear dislocation array is less than 100 (preferably less than 50, more preferably less than 30) on the gallium polar surface.

[26] A GaN single crystal having a gallium polar surface which is a main surface on one side and a nitrogen polar surface which is a main surface on the opposite side, wherein at least one fifth line segment and at least one sixth line segment which are virtual line segments can be drawn on at least one of the gallium polar surface and the nitrogen polar surface, the fifth and sixth line segments are defined by the following definitions (E) and (F), respectively:

(E) the fifth line segment is a line segment having a length $L_5$ (provided that $L_5$ is 40 mm or more), wherein, when measuring XRCs of the (002) reflection at intervals of 5 mm (preferably 3 mm, more preferably 1 mm, more preferably 0.6 mm) on the fifth line segment with the X-ray incidence plane parallel to the fifth line segment in each ω scan, selecting two points 10 mm apart from each other arbitrarily from all the measurement points, and calculating a curvature radius of the C-plane in a direction parallel to the fifth line segment from the XRC peak top angle difference $\Delta\omega$ between the two points by using a formula $R=\Delta L/\Delta\omega$ [where R is the curvature radius, and $\Delta L$ is the distance between the two points], an absolute value $R_5$ of the curvature radius is 40 m or more; and (F) the sixth line segment is a line segment having a length $L_6$ (provided that $L_6$ is 40 mm or more) and being orthogonal to the fifth line segment, wherein when measuring XRCs of the (002) reflection at intervals of 5 mm (preferably 3 mm on the sixth line segment, more preferably 1 mm, more preferably 0.6 mm) on the sixth line segment with the X-ray incidence plane parallel to the sixth line segment in each ω scan, selecting two points 10 mm apart from each other arbitrarily from all the measurement points and calculating a curvature radius of the C-plane in a direction parallel to the sixth line segment from the XRC peak top angle difference $\Delta\omega$ between the two points by using a formula $R=\Delta L/\Delta\omega$ [where R is the curvature radius, and $\Delta L$ is the distance between the two points], an absolute value $R_6$ of the curvature radius is 40 m or more.

[27] The GaN single crystal according to any one of [1] to [26], wherein any alkali or alkaline earth metal has a concentration of less than $1\times10^{16}$ atoms/cm$^3$.

[28] The GaN single crystal according to any one of [1] to [27], wherein any halogen has a concentration of less than $1\times10^{16}$ atoms/cm$^3$.

[29] The GaN single crystal according to any one of [1] to [28], containing hydrogen (H) at a concentration of $10^{17}$ atoms/cm$^3$ order or higher.

[30] The GaN single crystal according to any one of [1] to [29], wherein a peak attributable to a gallium vacancy-hydrogen complex is observed within a range of 3,100 to 3,500 cm$^{-1}$ in the infrared absorption spectrum of the crystal.

[31] The GaN single crystal according to any one of [1] to [30], which is a C-plane GaN wafer.

According to the present invention, a method for producing a GaN single crystal described below is provided.

[32] A method for producing a GaN single crystal, including the steps of:

(S1) preparing a seed having a nitrogen polar surface of GaN;

(S2) forming a pattern mask on the nitrogen polar surface of the prepared seed, the pattern mask having a plurality of linear openings arranged in parallel to each other at a constant pitch; and (S3) growing GaN crystal as on the nitrogen polar surface through the linear openings of the pattern mask by an ammonothermal method, wherein in the step (S3), the GaN crystals grow from inside the openings of the pattern mask, then spread laterally over the pattern mask, and coalesce with each other while forming voids between the pattern mask and the crystals.

[33] The production method according to [32], wherein in the pattern mask formed in the step (S2), an extending direction of the linear openings forms an angle within a range of 12°±5° with one of intersection lines between the nitrogen polar surface of the seed and the M-planes thereof.

[34] The production method according to [32] or [33], wherein the pattern mask is a stripe type.

[35] The production method according to [32] or [33], wherein the pattern mask is a rhomboid grid type.

[36] The production method according to [32] or [33], wherein the pattern mask is a hexagonal grid type.

[37] The production method according to any one of [32] to [36], wherein the constant pitch is 4 mm or more and 20 mm or less.

Effect of the Invention

According to the present invention, a novel GaN single crystal having an improved quality is provided. In addition, according to the present invention, there is provided a novel production method of a GaN single crystal for producing a GaN crystal having an improved quality.

BRIEF DESCRIPTION OF THE DRAWINGS

Each of FIGS. 1A and 1B illustrates a shape which a GaN single crystal according to an embodiment may have, with FIG. 1A being a perspective view and FIG. 1B being a side view.

FIG. 7B is a perspective view illustrating a state where a stripe type pattern mask is formed on the nitrogen polar surface of GaN of the seed as illustrated in FIG. 7A.

DESCRIPTION OF EMBODIMENTS

In a GaN crystal, a crystal axis parallel to the [0001] direction is referred to as a c-axis, that parallel to the <10-10> direction is referred to as an m-axis, and that parallel to the <11-20> direction is referred to as an a-axis. A crystal plane orthogonal to the c-axis is referred to as a C-plane, that orthogonal to the m-axis is referred to as an M-plane, and that orthogonal to the a-axis is referred to as an A-plane. Herein, when crystal axes, crystal planes, crystal orientations, and the like are mentioned, they mean crystal axes, crystal planes, crystal orientations, and the like of the GaN crystal, unless otherwise specified.

Hereinafter, embodiments of the present invention will be described with reference to drawings as required.

1. First Embodiment

A first embodiment of the present invention relates to a GaN single crystal.

1.1. Shape and Size of GaN Single Crystal

A GaN single crystal according to the first embodiment has a shape of a plate with a main surface on one side and a main surface on the opposite side, and its thickness direction is parallel or substantially parallel to the c-axis. One of the two main surfaces is a gallium polar surface, and the other is a nitrogen polar surface. The shape of the main surfaces is not particularly limited.

Figure 1A:
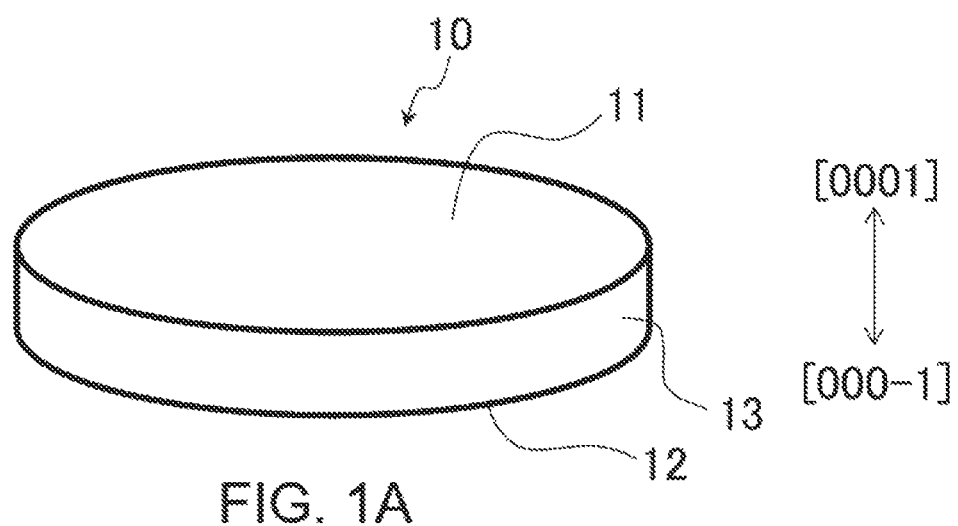
Figure 1B:
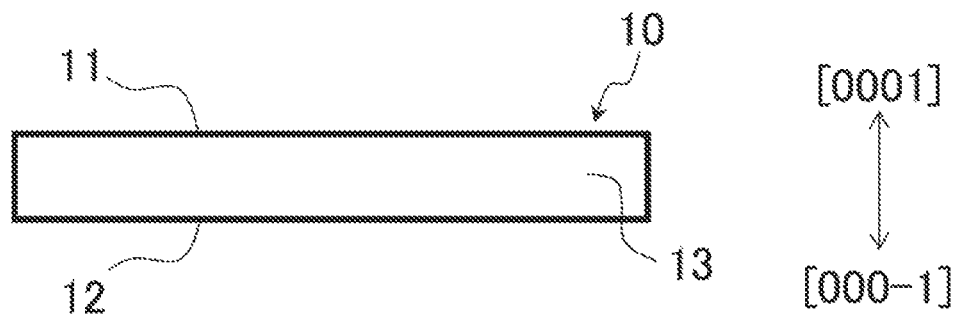

FIGS. 1A and 1B are drawings illustrating a shape which the GaN single crystal according to the first embodiment may have, with FIG. 1A being a perspective view and FIG. 1B being a side view. Referring to FIGS. 1A and 1B, a GaN single crystal 10 is a disk, and shapes of a gallium polar surface 11 as a main surface on the [0001] side and a nitrogen polar surface 12 as a main surface on the [000-1] side are circular. The gallium polar surface 11 and the nitrogen polar surface 12 are connected to each other via a side surface 13.

Figure 2A:
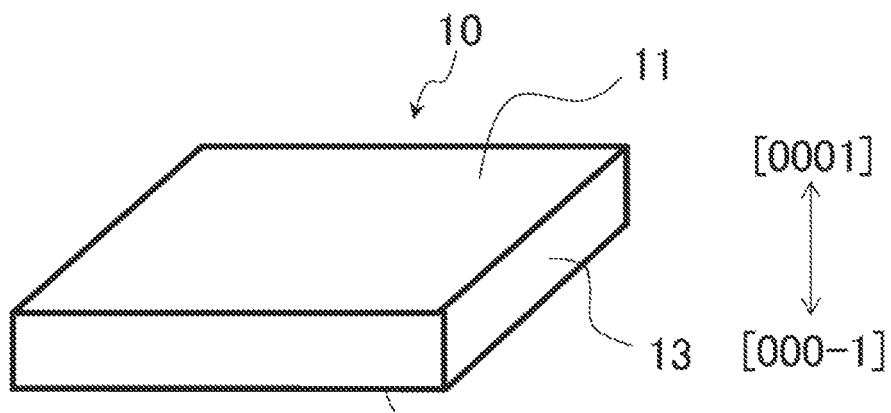
FIGS. 2A, 2B, and 2C are perspective views illustrating shapes which a GaN single crystal according to an embodiment may have.
Figure 2B:
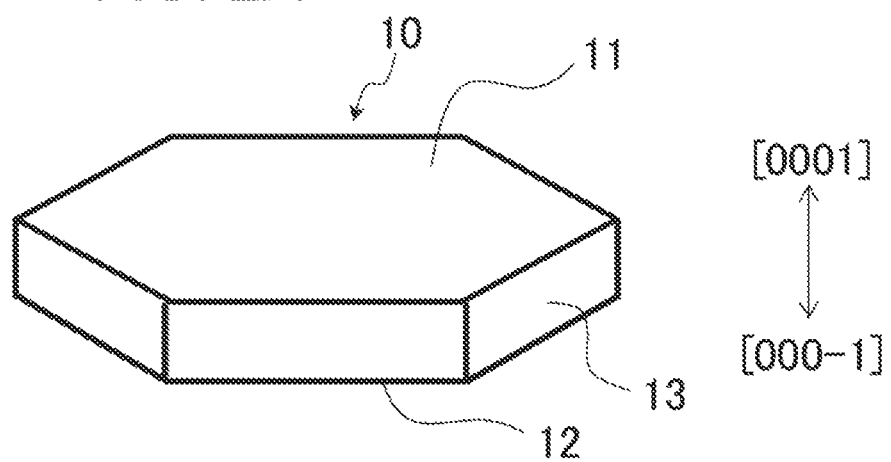
Figure 2C:
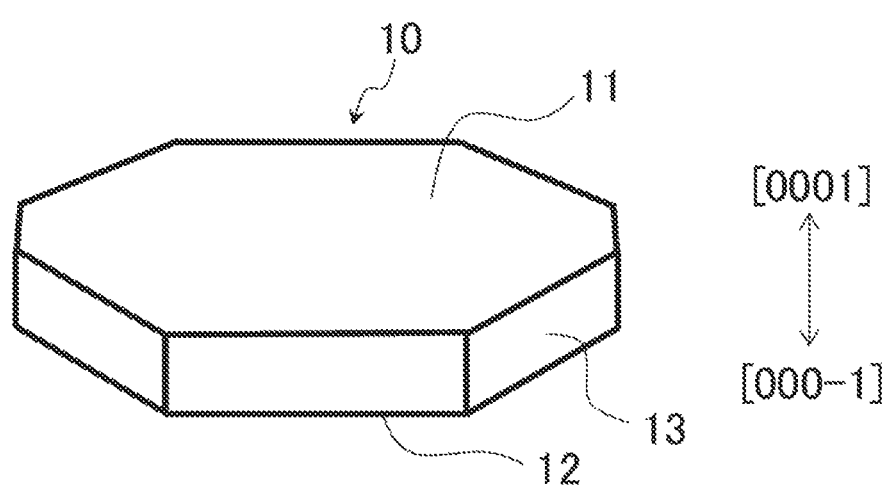

FIGS. 2A, 2B, and 2C are perspective views illustrating other shapes which the GaN single crystal according to the first embodiment may have. In FIGS. 2A and 2B, the same reference numerals as those in FIGS. 1A and 1B are assigned to constituents corresponding to those illustrated in FIGS. 1A and 1B (the same is true for FIG. 3 and FIG. 6 to be described later).

In FIGS. 2A to 2C, the shapes of the gallium polar surface 11 and the nitrogen polar surface 12 of the GaN single crystal 10 are quadrangular, hexagonal, and octagonal, respectively.

The main surface of the GaN single crystal according to the first embodiment has a size encompassing a 10 mm×10 mm square and the area of the main surface is preferably 4 $cm^2$ or more, more preferably 5 $cm^2$ or more, more preferably 15 $cm^2$ or more. The area of the main surface may be 18 $cm^2$ or more, 38 $cm^2$ or more, 71 $cm^2$ or more, 165 $cm^2$ or more, 299 $cm^2$ or more, or 683 $cm^2$ or more.

In the GaN single crystal of the first embodiment, the gallium polar surface may be parallel to the (0001) or slightly tilted therefrom. The tilt of the gallium polar surface from the (0001) is usually 10° or less, preferably 5° or less, more preferably 2° or less, and may be 1° or less.

In the GaN single crystal of the first embodiment, the nitrogen polar surface may be parallel to the (000-1) or slightly tilted therefrom. The tilt of the nitrogen polar surface from the (000-1) is usually 10° or less, preferably 5° or less, more preferably 2° or less, and may be 1° or less. The gallium polar surface and the nitrogen polar surface are preferably, but not limited to, parallel to each other.

The GaN single crystal of the first embodiment may be an ingot or a wafer (C-plane GaN wafer).

When the GaN single crystal of the first embodiment is a disc-shaped ingot or wafer, its diameter is usually 20 mm or more and 305 mm or less. The diameter is typically 25 mm (about 1 inch), 45 to 55 mm (about 2 inches), 95 to 105 mm (about 4 inches), 145 to 155 mm (about 6 inches), 195 to 205 mm (about 8 inches), 295 to 305 mm (about 12 inches), and the like.

When the GaN single crystal of the first embodiment is an ingot or a wafer having a rectangular main surface, the length of each side of the rectangle is usually 2 cm or more, preferably 3 cm or more, and usually 15 cm or less.

When the GaN single crystal of the first embodiment is a C-plane GaN wafer, it is required to be strong to an extent such that no inconvenience occurs in its handling, and therefore its thickness is preferably 250 μm or more, more preferably 300 μm or more. It can also be made thicker depending on the size of the main surface of the crystal.

For the C-plane GaN wafer, chamfering may be appropriately performed for smoothing the boundary between the gallium polar surface and the side surface, as necessary. The same is true for the boundary between the nitrogen polar surface and the side surface.

The side surface of the GaN single crystal of the first embodiment may be provided with not only an orientation flat which is a flat portion for indicating a crystal orientation, but also an index flat which is a flat portion for facilitating discrimination between the gallium polar surface and the nitrogen polar surface. In addition, various markings may be applied to the GaN single crystal of the first embodiment, as necessary.

1.2. Concentration of Alkali Metals, Alkaline Earth Metals, and Halogens

Concentrations of alkali metal, alkaline earth metal, and halogen contained as impurities in a GaN crystal are generally measured by SIMS (Secondary Ion Mass Spectrometry). The concentrations of alkali metal, alkaline earth metal, and halogen, as will be mentioned below, are values measured by SIMS at a depth of 1 μm or more from the surface the crystal.

In the GaN single crystal of the first embodiment, any alkali metal including lithium (Li), sodium (Na), and potassium (K) has a concentration of preferably less than $1 \times 10^{16}$ atoms/cm$^3$, more preferably $1 \times 10^{15}$ atoms/cm$^3$.

In the GaN single crystal of the first embodiment, any alkaline earth metal including magnesium (Mg) and calcium (Ca) has a concentration of preferably less than $1 \times 10^{16}$ atoms/cm$^3$, more preferably less than $1 \times 10^{15}$ atoms/cm$^3$.

The GaN single crystal of the first embodiment may comprise a GaN crystal grown by an ammonothermal method, and alkali or alkaline earth metal has a concentration of usually less than $1 \times 10^{15}$ atoms/cm$^3$ in a GaN crystal grown by an ammonothermal method using ammonium halide such as ammonium chloride (NH$_4$Cl), ammonium iodide (NH$_4$I), ammonium bromide (NH$_4$Br), and ammonium fluoride (NH$_4$F), as a mineralizer.

In the GaN single crystal of the first embodiment, even when it comprises the GaN crystal grown by an ammonothermal method using ammonium halides as a mineralizer, the concentration of any halogen including fluorine (F), chlorine (Cl), bromine (Br), and iodine (I) may be less than $1 \times 10^{16}$ atoms/cm$^3$ or even less than $5 \times 10^{15}$ atoms/cm$^3$. This means that the concentration of any halogen may be less than the lower detection limit in SIMS, because the lower detection limit concentration of halogen in GaN crystals by SIMS is approximately the order of $10^{14}$ to $10^{15}$ (atoms/cm$^3$) depending on the halogen species.

The concentration of halogen in a GaN crystal grown by an ammonothermal method is usually less than $5 \times 10^{15}$ atoms/cm$^3$ (less than the lower detection limit) except for halogen species contained in the mineralizer, while, in the GaN single crystal of the first embodiment, even the halogen species contained in the mineralizer may have such concentration value.

The GaN single crystal of the first embodiment usually contains hydrogen (H) at a concentration of the order of $10^{17}$ atoms/cm$^3$ or higher. The hydrogen concentration in the GaN single crystal of the first embodiment is typically $5 \times 10^{17}$ atoms/cm$^3$ or more, and may be $1 \times 10^{18}$ atoms/cm$^3$ or more. The hydrogen concentration in the GaN single crystal of the first embodiment is usually of the order of $10^{21}$ atoms/cm$^3$ or less, and may be $5 \times 10^{20}$ atoms/cm$^3$ or less, $1 \times 10^{20}$ atoms/cm$^3$ or less, $5 \times 10^{19}$ atoms/cm$^3$ or less, and the like.

When an infrared absorption spectrum of the GaN single crystal of the first embodiment is measured, a peak attributable to a gallium vacancy-hydrogen complex appears within a range from 3,100 to 3,500 cm$^{-1}$. Conventionally, similar infrared absorption peaks are known to be observed in ammonothermally grown GaN crystals, while such infrared absorption peaks are not observed in GaN crystals grown by HVPE methods or Na flux methods.

1.3. Dislocation Density

The GaN single crystal according to the first embodiment may have a linear dislocation array extending in a predetermined direction on its gallium polar surface. The angle which the extending direction of the linear dislocation array forms with one of intersection lines between the gallium polar surface and the M-planes is preferably within a range of 12°±5°. The angle may be within a range of 12°±3°, 12°±2°, or 12°±1°.

Figure 3:
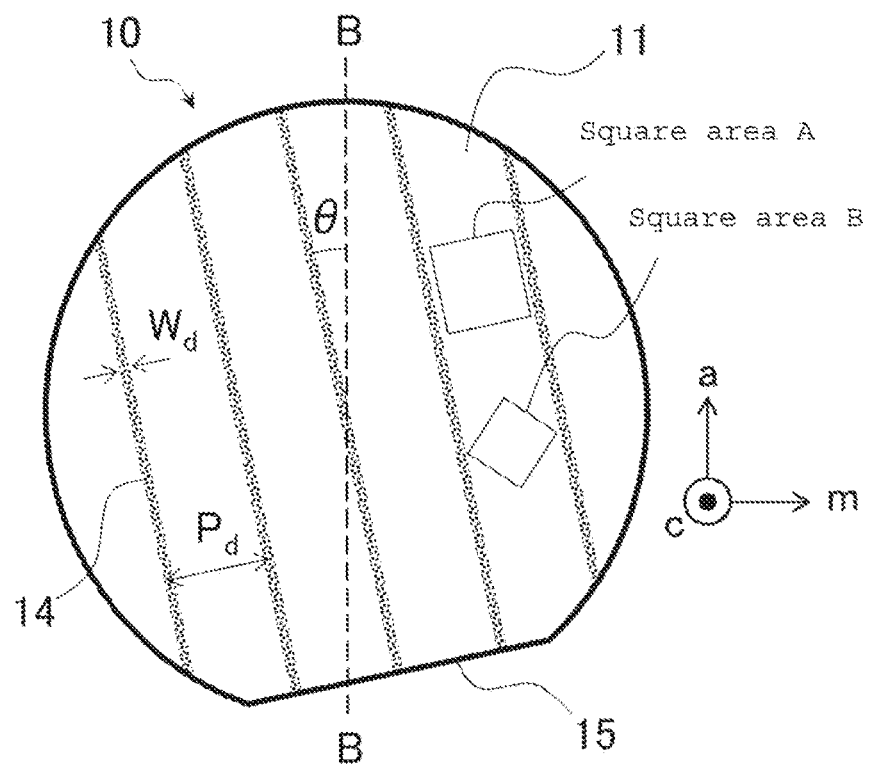
FIG. 3 is a plan view illustrating a GaN single crystal according to an embodiment.

FIG. 3 is a plan view illustrating an example of a GaN single crystal having linear dislocation arrays on the gallium polar surface.

Referring to in FIG. 3, the GaN single crystal 10 is a disk-shaped C-plane GaN wafer, on the gallium polar surface 11 of which are arranged at regular intervals a plurality of linear dislocation arrays 14 extending in the same direction. Therefore, the pitch $P_d$ between the dislocation arrays 14 is equal to the period of the stripe pattern formed by the plurality of dislocation arrays 14. The pitch $P_d$ between the dislocation arrays 14 is usually 3 mm or more, preferably 3.5 mm or more, more preferably 4 mm or more, and is usually 20 mm or less. The pitch $P_d$ between the dislocation arrays 14 may be 10.5 mm or less, 7.5 mm or less, or 5.5 mm or less. The width $W_d$ of the individual dislocation array 14 is usually less than 300 μm.

In FIG. 3, a broken line B-B represents one of intersection lines between the gallium polar surface 11 and the M-planes. Since the gallium polar surface 11 is parallel or substantially parallel to the (0001), the broken line B-B is parallel or substantially parallel to one of the a-axes. An angle θ between the extending direction of the linear dislocation arrays 14 and the broken line B-B is preferably within a range of 12°±5°. The angle θ may be within a range of 12°±3°, 12°±2°, or 12°+1°.

In the example of FIG. 3, the GaN single crystal 10 is provided with an orientation flat 15. The orientation flat 15 is placed at an edge in the extending direction of the linear dislocation arrays 14 and is orthogonal to the extending direction. In another example, the orientation flat may be provided parallel to the extending direction of the linear dislocation arrays. In yet another example, the orientation flat may be provided at the a-axis direction edge or the m-axis direction edge of the GaN single crystal.

Dislocations which a GaN single crystal has on the gallium polar surface can be visualized by etching the GaN single crystal. The reason is that etching under an appropriate condition creates, at a point where a dislocation is present, an etch pit observable with an optical microscope, a scanning electron microscope (SEM), or the like.

Figure 4:
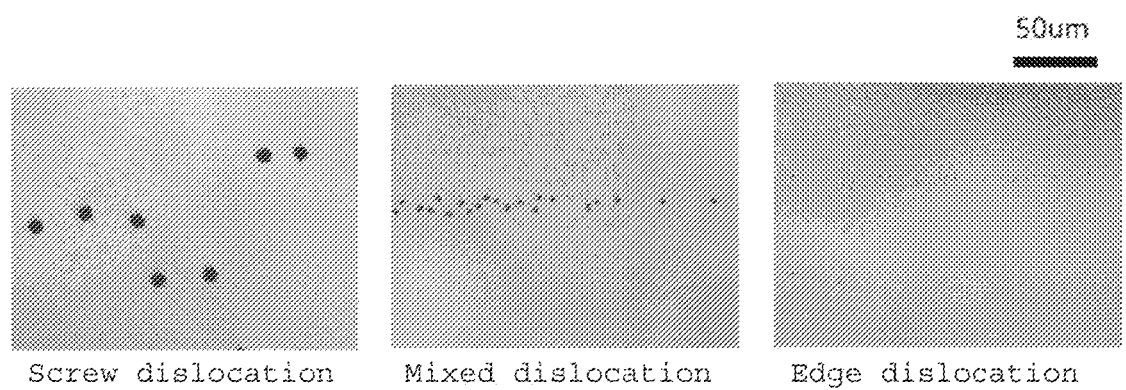
FIG. 4 is an optical microscopic image of etch pits corresponding to various dislocations.

As confirmed by the present inventors, etch pits are reliably formed which correspond to any type of dislocations (edge dislocations, screw dislocations, and mixed dislocations) present on the gallium polar surface of a GaN crystal when it is etched for more than one hour using 89% sulfuric acid heated to 270° C. as an etchant. FIG. 4 illustrates an optical microscopic image of the gallium polar surface of a GaN single crystal having etch pits formed under this etching condition.

The density of etch pits on the surface of a GaN crystal etched under such conditions that the etch pit is formed at a point where a dislocation is present is also referred to as "EPD" and is accepted, among those skilled in the art, as a value equal to or equivalent to the dislocation density.

Again referring to FIG. 3, the number of dislocations present in a 100 μm×100 μm square area on the gallium polar surface 11 of the GaN single crystal 10 falls below 100, and further it may fall below 50, even when the entirety of the square area overlaps with the linear dislocation array 14. On the gallium polar surface of the GaN single crystal according to a preferable example, the number of dislocations present in a 100 μm×100 μm square area is usually less than 30 (EPD<$3\times10^5$ cm$^{-2}$), and typically 1 to 20 ($1\times10^4$ cm$^{-2}$≤EPD≤$2\times10^5$ cm$^{-2}$) when the entirety of the square area overlaps with the linear dislocation array 14.

In parts other than the linear dislocation arrays 14, the EPD on the gallium polar surface 11 is even lower. In a preferable example, a first square area of which four sides constituting the outer periphery thereof each has a length of 2 mm or more and ($P_d$–0.5) mm or less may be found in a part sandwiched by two linear dislocation arrays 14.

Here, the first square area is defined as a square area such that when the area is divided into a plurality of sub-areas, each being a 100 μm×100 μm square (a square having a side length of 100 μm), 90% or more of the plurality of sub-areas are pit-free areas.

The pit-free area is an area where EPD is 0 (zero) cm$^{-2}$, i.e., where no etch pit is observed after etching under such conditions that an etch pit is formed at a point where a dislocation is present.

In a sub-area having the highest EPD among the sub-areas of 100 μm×100 μm constituting the first square area, the EPD is preferably less than $2\times10^5$ cm$^{-2}$, more preferably less than $1.5\times10^5$ cm$^{-2}$. Since the area of the sub-area is $10^{-4}$ cm$^{-2}$, the EPD of less than $2\times10^5$ cm$^{-2}$ in a certain sub-area means that the number of dislocations present in the sub-area is less than 20.

The average value of EPDs across the sub-areas of 100 μm×100 μm constituting the first square area is preferably less than $3\times10^3$ cm$^{-2}$, more preferably less than $2.5\times10^3$ cm$^{-2}$, more preferably less than $2\times10^3$ cm$^{-2}$.

In a preferred embodiment, the first square area may encompass a square pit-free area of 1.3 mm×1.3 mm.

The direction of the first square area is not limited, and two out of four sides constituting the outer periphery of the area may be parallel to the linear dislocation arrays 14, for example, as is the square area A illustrated in FIG. 3, or a diagonal line of the area may be perpendicular to the linear dislocation arrays 14, as is the square area B illustrated in FIG. 3.

The length of each of the four sides constituting the outer periphery of the first square area may be 10 mm or less, 7 mm or less, 5 mm or less, 3.5 mm or less, or the like.

In a preferred embodiment, a second square area of which four sides constituting the outer periphery thereof each has a length larger than ($P_d$–0.5) mm (where the unit of $P_d$ is mm) may be found on the gallium polar surface 11. Here, the second square area is defined as a square area such that when it is divided into a plurality of sub-areas each of which is a 100 μm×100 μm square, 80% or more of the plurality of sub-areas are pit-free areas.

Increasing the pitch $P_d$ between the linear dislocation arrays 14 is effective in increasing the percentage of the pit-free areas among the plurality of sub-areas constituting the second square area. For example, when $P_d$ is 4 mm or more, the percentage may reach 85% or more.

In a sub-area having the highest EPD among the sub-areas of 100 μm×100 μm constituting the second square area, the EPD falls below $1\times10^6$ cm$^{-2}$, and is usually less than $5\times10^5$ cm$^{-2}$, preferably less than $3\times10^5$ cm$^{-2}$, more preferably less than $2.5\times10^5$ cm$^{-2}$.

The average value of EPDs across the sub-areas of 100 μm×100 μm constituting the second square area is usually less than $1\times10^4$ cm$^{-2}$.

The length of each of four sides constituting the outer periphery of the second square area may be 10 mm or less, 7 mm or less, or 5 mm or less.

At least one square pit-free area of preferably 1.3 mm×1.3 mm, more preferably 1.5 mm×1.5 mm is found on the gallium polar surface of the GaN single crystal according to the first embodiment.

1.4. Anomalous transmission of X-Ray

The GaN single crystal according to the first embodiment may be a crystal from which an anomalous transmission image is obtainable by X-ray topography.

Figure 5:
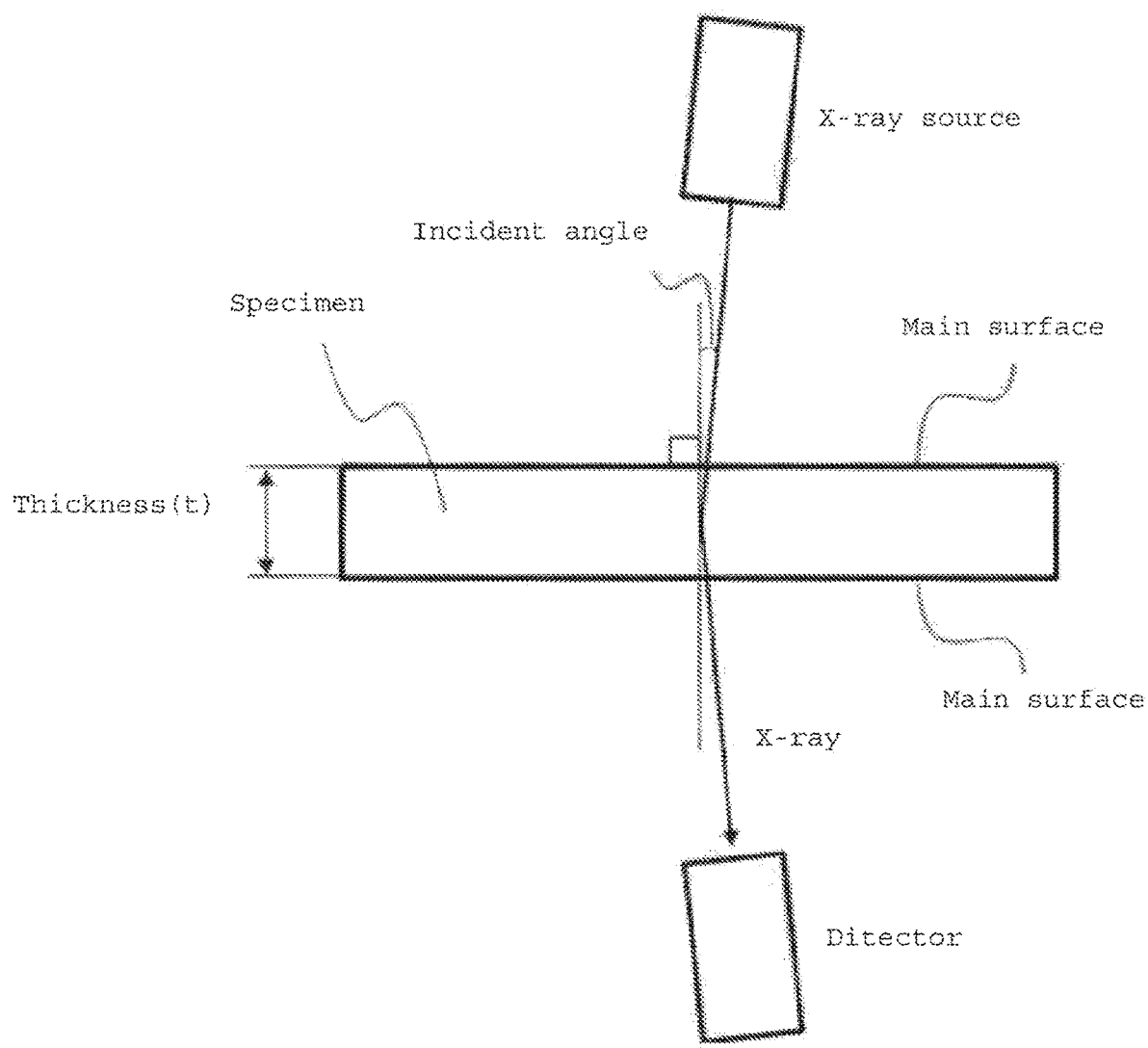
FIG. 5 illustrates an arrangement of an X-ray source, a test piece and a detector in transmission X-ray topography by the Lang Method.

FIG. 5 is a drawing illustrating an arrangement of an X-ray source, a test piece, and a detector in X-ray topography by the Lang method. The X-ray source is disposed on the side of one main surface of the plate-like test piece having a thickness t, and the X-ray detector is disposed on the side of the other main surface thereof.

The anomalous transmission of X-ray, which is also referred to as the Borrmann effect, is a phenomenon that X-ray is transmitted through a crystal which is so thick that the X-ray normally cannot be transmitted therethrough due to an absorption phenomenon. For example, if a transmission image is obtained from a C-plane GaN substrate with a thickness of 344 μm by X-ray topography using MoKα (wavelength 0.71073 Å) as an X-ray source, it is an anomalous transmission image. The reason is that, since the absorption coefficient μ of GaN is 290.40 cm$^{-1}$ when an X-ray source is MoKα, and therefore, the C-plane GaN substrate having a thickness t of 344 μm satisfies μ·t=10.0, it is impossible to obtain a transmission image under a condition of μt≥10 without anomalous transmission.

Since no anomalous transmission image is observed when crystal integrity is low, the fact that an anomalous transmission image is obtained by X-ray topography provides evidence for a good quality of the crystal as a whole. Although X-ray topography analysis utilizing anomalous transmission has already been performed for Si and GaAs single crystals [See, for example, J. R. Patel, Journal of Applied Physics, Vol. 44, pp. 3903-3906 (1973), and P. Mock, Journal of Crystal Growth, Vol. 224, pp. 11-20 (2001).], no observation of anomalous transmission of X-ray has been reported so far, to the best of the inventors' knowledge, regarding plate-like GaN single crystals the main surface of which is C-plane surface, such as C-plane GaN wafers.

In manufacturing a GaN single crystal product from which an anomalous transmission image is obtainable by X-ray topography, it is preferable to provide an inspection step comprising X-ray topography utilizing anomalous transmission as a test item. Through rejecting products in which unacceptable defects are found in the inspection step, only products with a good crystal quality can be shipped.

The GaN single crystal according to the first embodiment may be a single crystal such that each of its main surfaces has a size encompassing a square of 10 mm×10 mm and an anomalous transmission image of a 10 mm×10 mm square area is obtainable from the crystal by X-ray topography. In other words, it may be a single crystal having a 10 mm×10 mm square area on at least a part of its main surface, through which area X-ray is transmitted owing to the Borrmann effect.

1.5. XRC-FWHM of (002) Reflection

At least one first line segment which is a virtual line segment defined by the following definition (A) can be desirably drawn on at least one main surface of the GaN single crystal according to the first embodiment:

(A) the first line segment is a line segment having a length $L_1$, wherein when XRC-FWHMs of the (002) reflection are measured at 0.2 mm intervals on the first line segment with the X-ray incidence plane parallel to the first line segment in each ω scan, the measured values fall below 50 arcsec at 90% or more of all the measurement points, provided that the length $L_1$ is 20 mm or more, preferably 30 mm or more, more preferably 40 mm or more, more preferably 50 mm or more, and more preferably 60 mm or more. The "incidence plane" is a general term used in optics, and means a "plane perpendicular to a reflection plane and containing an incident beam and a reflected beam" (the same is true herein in any other descriptions for the incidence plane).

The XRC is an X-ray rocking curve (or X-ray diffraction rocking curve), and its FWHM (Full Width at Half Maximum) is an index generally used for evaluation of crystal quality. In this specification, the full width at half maximum of the XRC may be abbreviated as XRC-FWHM.

Since the measurement interval is 0.2 mm, the number of the XRC-FWHM measurement points on the first line segment is 100 when the length $L_1$ of the first line segment is 20 mm.

Hereinafter, a main surface which the GaN single crystal according to the first embodiment may have and on which the first line segment mentioned above can be drawn will be referred to as a "first main surface."

The first main surface may be any of the gallium polar surface and the nitrogen polar surface. In the GaN single crystal according to an example, both the gallium polar surface and the nitrogen polar surface may each correspond to the first main surface.

There is no limitation on the direction of the first line segment on the first main surface.

The length of the first line segment may be 90% or more of the size of the first main surface measured along the direction parallel to the first line segment, but it is not limited thereto.

The first line segment may be a line segment which does not contain therein a part being distant from the outer periphery of the first main surface by less than 2 mm, but it is not limited thereto.

The first line segment may be a line segment which passes through the center (center of gravity) of the first main surface, but it is not limited thereto.

In addition to the characteristics included in the above definition (A), the first line segment preferably has one or more characteristics selected from the following (A1) to (A3):

(A1) when XRC-FWHMs of the (002) reflection are measured at 0.2 mm intervals on the first line segment with the X-ray incidence plane parallel to the first line segment in each ω scan, the measured values are less than 50 arcsec at 95% or more, preferably 98% or more, more preferably 99% or more, and more preferably 100% of all the measurement points;

(A2) when XRC-FWHMs of the (002) reflection are measured at 0.2 mm intervals on the first line segment with the X-ray incidence plane parallel to the first line segment in each ω scan, the measured values are less than 40 arcsec at 90% or more, preferably 95% or more, more preferably 98% or more of all the measurement points; and (A3) when XRC-FWHMs of the (002) reflection are measured at 0.2 mm intervals on the first line segment with the X-ray incidence plane parallel to the first line segment in each ω scan, the measured values are less than 30 arcsec at 90% or more, preferably 95% or more, more preferably 98% or more of all the measurement points.

It is desirable that at least one second line segment which is a virtual line segment defined by the following definition (B) can be further drawn on the first main surface:

(B) the second line segment is a line segment having a length $L_2$ and being orthogonal to at least one first line segment, wherein when XRC-FWHMs of the (002) reflection are measured at 0.2 mm intervals on the second line segment with the X-ray incidence plane parallel to the second line segment in each w scan, the measured values fall below 50 arcsec at 90% or more of all the measurement points, provided that, the length $L_2$ is 20 mm or more, preferably 30 mm or more, more preferably 40 mm or more, more preferably 50 mm or more, and more preferably 60 mm or more.

Since the measurement interval is 0.2 mm, the number of the XRC-FWHM measurement points on the second line segment is 100 when the length of the second line segment is 20 mm.

The length of the second line segment may be 90% or more of the size of the first main surface measured along the direction parallel to the second line segment, but it is not limited thereto.

The second line segment can be a line segment which does not contain therein a part being distant from the outer periphery of the first main surface by less than 2 mm, but it is not limited thereto.

The second line segment may be a line segment which passes through the center (center of gravity) of the first main surface, but it is not limited thereto.

In addition to the characteristics included in the above definition (B), the second line segment preferably has one or more characteristics selected from the following (B1) to (B3):

(B1) when XRC-FWHMs of the (002) reflection are measured at 0.2 mm intervals on the second line segment with the X-ray incidence plane parallel to the second line segment in each ω scan, the measured values are less than 50 arcsec at 95% or more, preferably 98% or more, more preferably 99% or more, and more preferably 100% of all the measurement points;

(B2) when XRC-FWHMs of the (002) reflection are measured at 0.2 mm intervals on the second line segment with the X-ray incidence plane parallel to the second line segment in each ω scans, the measured values are less than 40 arcsec at 90% or more, preferably 95% or more, more preferably 98% or more of all the measurement points; and (B3) when XRC-FWHMs of the (002) reflection are measured at 0.2 mm intervals on the second line segment with the X-ray incidence plane parallel to the second line segment in each ω scan, the measured values are less than 30 arcsec at 90% or more, preferably 95% or more, more preferably 98% or more of all the measurement points.

Figure 6:
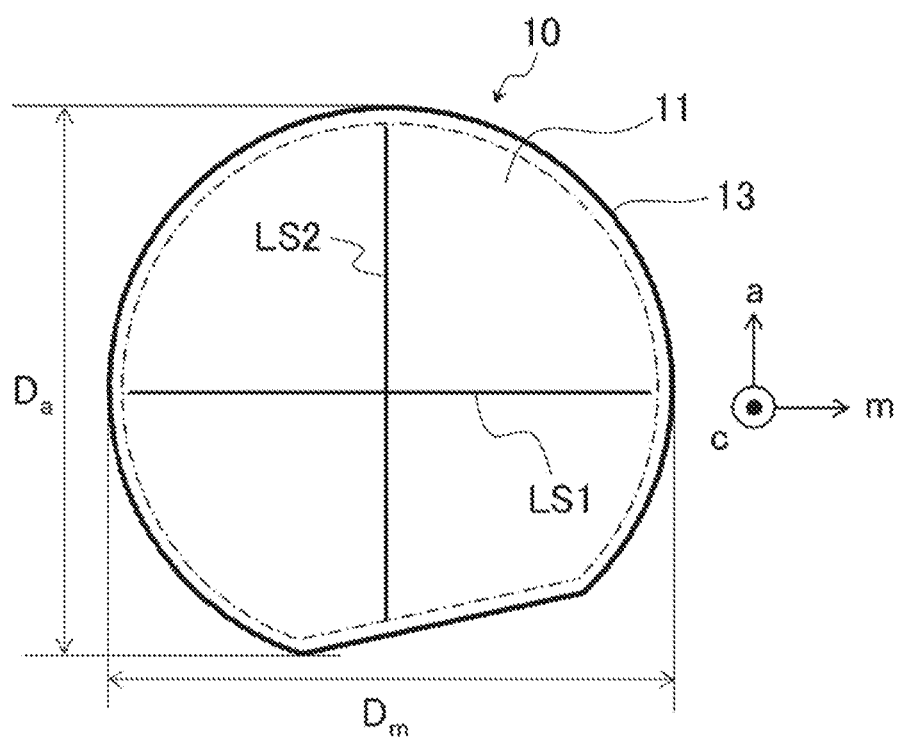
FIG. 6 is a plan view illustrating a GaN single crystal.

FIG. 6 illustrates an example of a GaN single crystal having a main surface on which can be drawn a virtual line segment corresponding to the first line segment and that corresponding to the second line segment.

The GaN single crystal 10 illustrated in FIG. 6 is a GaN wafer or a GaN ingot having a gallium polar surface 11 parallel to the (0001) plane, and a virtual line segment LS1 corresponding to the first line segment and a virtual line segment LS2 corresponding to the second line segment can be drawn on the gallium polar surface 11.

The line segment LS1 is parallel to the m-axis, and the line segment LS2 orthogonal to the line segment LS1 is parallel to the a-axis.

The length of the line segment LS1 is 20 mm or more and may be 90% or more of the size $D_m$ of the gallium polar surface 11 measured along the m-axis direction. The length of the line segment LS2 is 20 mm or more and may be 90% or more of the size $D_a$ of the gallium polar surface 11 measured along the a-axis direction.

The long dashed dotted line drawn on the gallium polar surface 11 is a boundary line between an area distant by less than 2 mm and that distant by 2 mm or more from the outer periphery of the gallium polar surface 11. Neither the line segment LS1 nor the line segment LS2 has a portion thereof protruding to outside the area enclosed by the long dashed dotted line.

When XRC-FWHMs of the (002) reflection are measured at 0.2 mm intervals on the line segment LS1 with the X-ray incidence plane parallel to the line segment LS1 in each ω scan, the measured values are less than 50 arcsec at 90% or more of all the measurement points.

When XRC-FWHMs of the (002) reflection are measured at 0.2 mm intervals on the line segment LS2 with the X-ray incidence plane parallel to the line segment LS2 in each ω scan, the measured values are less than 50 arcsec at 90% or more of all the measurement points.

1.6. XRC-FWHM of (004) Reflection

In the GaN single crystal according to the first embodiment, it is desirable that at least one third line segment which is a virtual line segment defined by the following definition (C) can be drawn on at least one main surface of the crystal:

(C) the third line segment is a line segment having a length $L_3$, wherein when XRC-FWHMs of the (004) reflection are measured at 1 mm intervals on the third line segment with the X-ray incidence plane parallel to the third line segment in each ω scan, an average of the measured values across all the measurement points falls below 20 arcsec, provided that, the length $L_3$ is 20 mm or more, preferably 30 mm or more, more preferably 40 mm or more, more preferably 50 mm or more, and more preferably 60 mm or more.

Since the measurement interval is 1 mm, the number of the XRC-FWHM measurement points on the third line segment is 20 when the length $L_3$ of the third line segment is 20 mm.

Hereinafter, a main surface which the GaN single crystal according to the first embodiment may have and on which the third line segment mentioned above can be drawn will be referred to as a "third main surface."

The third main surface may be any of the gallium polar surface and the nitrogen polar surface. In the GaN single crystal according to an example, both the gallium polar surface and the nitrogen polar surface may each correspond to the third main surface.

There is no limitation on the direction of the third line segment on the third main surface.

The length of the third line segment may be 90% or more of the size of the third main surface measured along the direction parallel to the third line segment, but it is not limited thereto.

The third line segment may be a line segment which does not contain therein a part being distant from the outer periphery of the third main surface by less than 2 mm, but it is not limited thereto.

The third line segment can be a line segment which passes through the center (center of gravity) of the third main surface, but it is not limited thereto.

It is preferable that the third line segment has, in addition to the characteristics included in the above definition (C), one or more characteristics selected from the following (C1) and (C2):

(C1) when XRC-FWHMs of the (004) reflection are measured at 1 mm intervals on the third line segment with the X-ray incidence plane parallel to the third line segment in each ω scan, an average of the measured values across all the measurement points is less than 15 arcsec; and (C2) when XRC-FWHMs of the (004) reflection are measured at 1 mm intervals on the third line segment with the X-ray incidence plane parallel to the third line segment in each ω scan, a standard deviation of the measured values across all the measurement points is less than 5 arcsec.

It is desirable that at least one fourth line segment which is a virtual line segment defined by the following definition (D) can be further drawn on the third main surface:

(D) the fourth line segment is a line segment having a length $L_4$ and being orthogonal to at least one third line segment, wherein when XRC-FWHMs of the (004) reflection are measured at 1 mm intervals on the fourth line segment with the X-ray incidence plane parallel to the fourth line segment in each co scan, an average of the measured values across all the measurement points falls below 20 arcsec, provided that, the length $L_4$ is 20 mm or more, preferably 30 mm or more, more preferably 40 mm or more, more preferably 50 mm or more.

Since the measurement interval is 1 mm, the number of the XRC-FWHM measurement points is 20 when the length of the fourth line segment is 20 mm.

The length of the fourth line segment may be 90% or more of the size of the third main surface measured along the direction parallel to the fourth line segment, but it is not limited thereto.

The fourth line segment may be a line segment which does not contain therein a part being distant from the outer periphery of the third main surface by less than 2 mm, but it is not limited thereto.

The fourth line segment may be a line segment which passes through the center (center of gravity) of the third main surface, but it is not limited thereto.

The fourth line segment preferably has, in addition to the characteristics included in the above-described definition (D), one or more characteristics selected from the following (D1) and (D2):

(D1) when XRC-FWHMs of the (004) reflection are measured at 1 mm intervals on the fourth line segment with the X-ray incidence plane parallel to the fourth line segment in each ω scan, an average of the measured values across all the measurement points is less than 15 arcsec; and (D2) when XRC-FWHMs of the (004) reflection are measured at 1 mm intervals on the fourth line segment with the X-ray incidence plane parallel to the fourth line segment in each ω scan, a standard deviation of the measured values across all the measurement points is less than 5 arcsec.

1.7. Radius of Curvature of C-Plane

In the GaN single crystal according to the first embodiment, it is desirable that at least one fifth line segment and at least one sixth line segment can each be drawn on at least one main surface of the crystal, the fifth and sixth line segments being defined by the following definitions (E) and (F), respectively:

(E) the fifth line segment is a line segment having a length $L_5$ ($L_5$ is 40 mm or more), wherein when measuring XRCs of the (002) reflection at intervals of 5 mm (preferably 3 mm, more preferably 1 mm, more preferably 0.6 mm) on the fifth line segment with the X-ray incidence plane parallel to the fifth line segment in each ω scan, selecting two points 10 mm apart from each other arbitrarily from all the measurement points, and calculating a curvature radius of the C-plane in a direction parallel to the fifth line segment from the XRC peak top angle difference Δω between the two points by using the following formula 1, $$R = \Delta L / \Delta \omega \quad \text{(formula 1)},$$

where R is the curvature radius, and ΔL is the distance between the two points (in this case 10 mm), an absolute value $R_5$ of the curvature radius is 40 m or more; and (F) the sixth line segment is a line segment having a length $L_6$ ($L_6$ is 40 mm or more) and being orthogonal to the fifth line segment, wherein when measuring XRCs of the (002) reflection at intervals of 5 mm (preferably 3 mm, more preferably 1 mm, more preferably 0.6 mm) on the sixth line segment with the X-ray incidence plane parallel to the sixth line segment in each ω scan, selecting two points 10 mm apart from each other arbitrarily from all the measurement points, and calculating a curvature radius of the C-plane in a direction parallel to the sixth line segment from the XRC peak top angle difference Δω between the two points by using the above-described formula 1, an absolute value $R_6$ of the curvature radius is 40 m or more.

In order that the fifth line segment and the sixth line segment can be drawn on the main surface of the GaN single crystal, the size of the main surface has to be larger than 40 mm in the direction of the fifth line segment and in that of the sixth line segment.

In the above-described definition (E), the length $L_5$ of the fifth line segment may be 40 mm, and is preferably 45 mm, more preferably 50 mm, and may be even more than 50 mm.

The absolute value $R_5$ of the curvature radius of the C-plane, defined by the above-described definition (E) is preferably 50 m or more, more preferably 60 m or more, more preferably 70 m or more.

In the above-described definition (F), the length $L_6$ of the sixth line segment may be 40 mm, and is preferably 45 mm, and may be even more than 45 mm.

The absolute value $R_6$ of the curvature radius of the C-plane, defined by the above-described definition (F) is preferably 50 m or more.

1.8. Use of GaN single crystal (1) Seed

The GaN single crystal according to the first embodiment may be used as a seed when a nitride semiconductor crystal is grown by various methods including vapor phase methods, liquid phase methods, and ammonothermal methods.

For example, a bulk GaN single crystal may be obtained by epitaxially growing, by an optional method, GaN on the C-plane GaN wafer according to the first embodiment.

In another example, a first bulk GaN single crystal may be grown using the GaN single crystal according to the first embodiment as a seed, and then a part or the whole of the first GaN single crystal may be used as a seed to grow a second bulk GaN single crystal.

(2) Nitride Semiconductor Device

When the GaN single crystal according to the first embodiment is a C-plane GaN wafer, nitride semiconductor devices may be produced using the C-plane GaN wafer.

Normally, one or more nitride semiconductors are epitaxially grown on the C-plane GaN wafer to form an epitaxial wafer provided with a nitride semiconductor device structure. Preferably usable epitaxial growth methods include MOCVD methods, MBE methods, and pulse deposition methods, which are suitable for forming thin films. The nitride semiconductor device structure may be formed on any of the gallium polar surface and the nitrogen polar surface of the C-plane GaN wafer. The epitaxial wafer, after provided with necessary structures such as electrodes and protective films, is divided into nitride semiconductor device chips.

Specific examples of the nitride semiconductor device include light emitting devices such as light emitting diodes and laser diodes, electronic devices, such as rectifiers, bipolar transistors, field effect transistors, and HEMTs (High Electron Mobility Transistors), semiconductor sensors, such as temperature sensors, pressure sensors, and radiation sensors, visible-ultraviolet light detectors, solar cells, and the like.

In addition, the C-plane GaN wafer according to the first embodiment may be also used for applications such as SAW (Surface Acoustic Wave) devices, vibrators, resonators, oscillators, MEMS (Micro Electro Mechanical System) components, voltage actuators, and electrodes for artificial photosynthetic devices.

2. Second Embodiment

A second embodiment of the present invention relates to a nitride semiconductor device chip.

The nitride semiconductor device chip according to the second embodiment is produced using the C-plane GaN wafer according to the first embodiment. When one or more kinds of nitride semiconductors are epitaxially grown on the C-plane GaN wafer of the first embodiment to form an epitaxial wafer with a nitride semiconductor device structure, and the epitaxial wafer is then divided into individual elements by using a dicer, a scriber, a laser processing machine, or the like, the resulting chips are the nitride semiconductor device chips according to the second embodiment. Normally, prior to dividing the epitaxial wafer into chips, individual elements on the wafer are provided with necessary structures such as electrodes and protective films, depending on the kind of the device.

The structure of the nitride semiconductor device chip according to the second embodiment is exemplified below.

(Chip Structure 1)

A nitride semiconductor device chip comprising: a C-plane GaN substrate including a gallium polar surface and a nitrogen polar surface; and one or more nitride semiconductor layers disposed on the gallium polar surface or the nitrogen polar surface, wherein the C-plane GaN substrate has at least one square area on the gallium polar surface, the length of each of four sides constituting the outer periphery of the at least one square area is 2 mm or more, and, when the at least one square area is divided into a plurality of sub-areas each being a 100 μm×100 μm square, 80% or more of the plurality of sub-areas are dislocation-free areas each having a dislocation density of 0 (zero) $cm^{-2}$.

(Chip Structure 2)

The nitride semiconductor device chip according to the chip structure 1, wherein 85% or more of the plurality of sub-areas are dislocation-free areas.

(Chip Structure 3)

The nitride semiconductor device chip according to the chip structure 2, wherein 90% or more of the plurality of sub-areas are dislocation-free areas.

(Chip Structure 4)

The nitride semiconductor device chip according to any one of the chip structures 1 to 3, wherein in the sub-area having the highest dislocation density among the plurality of sub-areas, the dislocation density is less than $3\times10^5$ $cm^{-2}$.

(Chip Structure 5)

The nitride semiconductor device chip according to any one of the chip structures 1 to 4, wherein an average value of the dislocation density across the plurality of sub-areas is less than $1\times10^4$ $cm^{-2}$.

(Chip Structure 6)

The nitride semiconductor device chip according to the chip structure 3, wherein in the sub-area having the highest dislocation density among the plurality of sub-areas, the dislocation density is less than $2\times10^5$ $cm^{-2}$.

(Chip Structure 7)

The nitride semiconductor device chip according to the chip structure 3 or 6, wherein an average value of the dislocation density across the plurality of sub-areas is less than $3\times10^3$ $cm^{-2}$.

(Chip Structure 8)

The nitride semiconductor device chip according to the chip structure 3, 6, or 7, wherein the length of each of four sides constituting the outer periphery of the at least one square area is 3.5 mm or less.

(Chip Structure 9)

The nitride semiconductor device chip according to the chip structure 3, 6, 7 or 8, wherein the planar shape of the C-plane GaN substrate is a rectangle and two out of the four sides of the rectangle form an angle within a range of 12°±5° with one of intersection lines between the Ga polar surface and the M-planes.

(Chip Structure 10)

A nitride semiconductor device chip comprising: a C-plane GaN substrate having a gallium polar surface and a nitrogen polar surface; and one or more nitride semiconductor layers disposed on the gallium polar surface or the nitrogen polar surface, wherein the planar shape of the C-plane GaN substrate is a rectangle and two out of the four sides of the rectangle form an angle within a range of 12°±5° with one of intersection lines between the Ga polar surface and the M-planes.

(Chip Structure 11)

The nitride semiconductor device chip according to any one of the chip structures 1 to 10, having a linear dislocation array on the gallium polar surface.

(Chip Structure 12)

The nitride semiconductor device chip according to the chip structure 11, wherein the extending direction of the linear dislocation array forms an angle within a range of 12°±5° with one of intersection lines between the gallium polar surface and the M-planes.

(Chip Structure 13)

A nitride semiconductor device chip comprising: a C-plane GaN substrate including a gallium polar surface and a nitrogen polar surface; and one or more nitride semiconductor layers disposed on the gallium polar surface or the nitrogen polar surface, wherein the C-plane GaN substrate has a linear dislocation array on the gallium polar surface and the extending direction of the linear dislocation array forms an angle within a range of 12°±5° with one of intersection lines of the gallium polar surface and the M-planes.

(Chip Structure 14)

The nitride semiconductor device chip according to any one of the chip structures 11 to 13, wherein the gallium polar surface has less than 100 (preferably less than 50, more preferably less than 30) dislocations present in a 100 μm×100 μm square area entirely overlapping with the linear dislocation array.

(Chip Structure 15)

The nitride semiconductor device chip according to any one of the chip structures 1 to 14, wherein any alkali or alkaline-earth metal has a concentration of less than $1\times10^{16}$ atoms/$cm^3$ in the C-plane GaN substrate.

(Chip Structure 16)

The nitride semiconductor device chip according to any one of the chip structures 1 to 15, wherein any halogen has a concentration of less than $1\times10^{16}$ atoms/$cm^3$ in the C-plane GaN substrate.

(Chip Structure 17)

The nitride semiconductor device chip according to any one of the chip structures 1 to 16, wherein the C-plane GaN substrate contains hydrogen (H) at a concentration of the order of $10^{17}$ atoms/$cm^3$ or higher.

(Chip Structure 18)

A nitride semiconductor device chip according to any one of the chip structures 1 to 17, wherein a peak attributable to a gallium vacancy-hydrogen complex is observed within a range of 3,100 to 3,500 $cm^{-1}$ of the infrared absorption spectrum of the C-plane GaN substrate.

3. Third Embodiment

A third embodiment of the present invention relates to a GaN layer-bonded substrate.

The GaN layer-bonded substrate is a composite substrate comprising a heterogeneous substrate having a chemical composition different from that of GaN and a GaN layer bonded thereto, and may be used for producing light emitting devices and other semiconductor devices. With regard to details of the structure, production methods, applications, and others of the GaN layer-bonded substrate, reference may be made to, for example, JP-A-2006-210660 and JP-A-2011-44665.

The GaN layer-bonded substrate according to the third embodiment is produced using the GaN single crystal according to the first embodiment as a raw material.

The GaN layer-bonded substrate is typically produced by performing, in the order mentioned below, the steps of implanting ions into a region near the main surface of a plate-like GaN single crystal, bonding the main surface side of the plate-like GaN single crystal to a heterogamous substrate, and separating the plate-like GaN single crystal at the ion-implanted zone as a boundary, thereby forming a GaN layer bonded to the heterogamous substrate.

Methods of producing the GaN layer-bonded substrate also include a method without ion implantation, wherein a plate-like GaN single crystal is bonded to a heterogeneous substrate and the plate-like GaN single crystal is then mechanically cut to form a GaN layer bonded to the heterogamous substrate.

When the GaN single crystal according to the first embodiment is used as a raw material, any one of these methods can provide a GaN layer-bonded substrate having a structure in which the GaN layer separated from the GaN single crystal of the first embodiment is bonded to the heterogeneous substrate.

The GaN single crystal according to the first embodiment, when used as a raw material of the GaN layer-bonded substrate, may have an initial thickness of 1 mm or more, 2 mm or more, and 4 mm or more.

Examples of the heterogeneous substrate usable for producing the GaN layer-bonded substrate include sapphire substrates, AlN substrates, SiC substrates, ZnSe substrates, Si substrates, ZnO substrates, ZnS substrates, quartz substrates, spinel substrates, carbon substrates, diamond substrates, $Ga_2O_3$ substrates, $ZrB_2$ substrates, Mo substrates, W substrates, ceramic substrates, and the like.

Structures of the GaN layer-bonded substrate according to the third embodiment are exemplified below.

(Bonded Substrate Structure 1)

A GaN layer-bonded substrate comprising: a GaN layer having main surfaces one of which is a gallium polar surface and the other of which is a nitrogen polar surface; and a heterogeneous substrate bonded to the gallium polar surface side or the nitrogen polar surface side of the GaN layer, wherein the GaN layer has at least one square area on the gallium polar surface, the length of each of four sides constituting the outer periphery of the at least one square area is 2 mm or more, and, when the at least one square area is divided into a plurality of sub-areas each being a 100 μm×100 μm square, 80% or more of the plurality of sub-areas are dislocation-free areas having a dislocation density of 0 (zero) $cm^{-2}$.

(Bonded Substrate Structure 2)

The GaN layer-bonded substrate according to the bonded substrate structure 1, wherein 85% or more of the plurality of sub-areas are dislocation-free areas.

(Bonded Substrate Structure 3)

The GaN layer-bonded substrate according to the bonded substrate structure 2, wherein 90% or more of the plurality of sub-areas are dislocation-free areas.

(Bonded Substrate Structure 4)

The GaN layer-bonded substrate according to any one of the bonded substrate structures 1 to 3, wherein in the sub-area having the highest dislocation density among the plurality of sub-areas, the dislocation density is less than $3\times10^5$ $cm^{-2}$.

(Bonded Substrate Structure 5)

The GaN layer-bonded substrate according to any one of the bonded substrate structures 1 to 4, wherein an average value of dislocation densities across the plurality of sub-areas is less than $1\times10^4$ $cm^{-2}$.

(Bonded Substrate Structure 6)

The GaN layer-bonded substrate according to the bonded substrate structure 3, wherein in the sub-area having the highest dislocation density among the plurality of sub-areas, the dislocation density is less than $2\times10^5$ $cm^{-2}$.

(Bonded Substrate Structure 7)

The GaN layer-bonded substrate according to the bonded substrate structure 3 or 6, wherein an average value of dislocation densities across the plurality of sub-areas is less than $3\times10^3$ $cm^{-2}$.

(Bonded Substrate Structure 8)

The GaN layer-bonded substrate according to the bonded substrate structure 3, 6, or 7, wherein the length of each of four sides constituting the outer periphery of the at least one square area is 3.5 mm or less.

(Bonded Substrate Structure 9)

A GaN layer-bonded substrate comprising: a GaN layer having main surfaces one of which is a gallium polar surface and the other of which is a nitrogen polar surface; and a heterogeneous substrate bonded to the gallium polar surface side or the nitrogen polar surface side of the GaN layer, wherein at least one first line segment which is a virtual line segment can be drawn on at least one of the gallium polar surface and the nitrogen polar surface, the first line segment being defined by the following definition (A):

(A) the first line segment is a line segment having a length of 20 mm or more, wherein when XRC-FWHMs of the (002) reflection are measured at 0.2 mm intervals on the first line segment with the X-ray incidence plane parallel to the first line segment in each ω scan, the measured values fall below 50 arcsec at 90% or more of all the measurement points.

(Bonded Substrate Structure 10)

The GaN layer-bonded substrate according to the bonded substrate structure 9, wherein at least one second line segment which is a virtual line segment can be drawn on the gallium polar surface or the nitrogen polar surface on which the first line segment can be drawn, the second line segment being defined by the following definition (B):

(B) the second line segment is a line segment having a length of 20 mm or more and is orthogonal to at least one of the first line segment, wherein when XRC-FWHMs of the (002) reflection are measured at 0.2 mm intervals on the second line segment with the X-ray incidence plane parallel to the second line segment in each ω scan, the measured values fall below 50 arcsec at 90% or more of all the measurement points.

(Bonded Substrate Structure 11)

The GaN layer-bonded substrate according to any one of the bonded substrate structures 1 to 10, having a linear dislocation array on the gallium polar surface.

(Bonded Substrate Structure 12)

A GaN layer-bonded substrate according to the bonded substrate structure 11, wherein the extending direction of the linear dislocation array forms an angle within a range of 12°±5° with one of intersection lines between the gallium polar surface and the M-planes.

(Bonded Substrate Structure 13)

A GaN layer-bonded substrate comprising: a GaN layer having main surfaces one of which is a gallium polar surface and the other of which is a nitrogen polar surface; and a heterogeneous substrate bonded to the gallium polar surface side or the nitrogen polar surface side of the GaN layer, wherein the GaN layer has a linear dislocation array on the gallium polar surface, wherein the extending direction of the linear dislocation array forms an angle within a range of 12°±5° with one of intersection lines between the gallium polar surface and the M-planes.

(Bonded Substrate Structure 14)

The GaN layer-bonded substrate according to any one of the bonded substrate structures 11 to 13, wherein the gallium polar surface has less than 100 (preferably less than 50, more preferably less than 30) dislocations present in a 100 µm×100 µm square area entirely overlapping with the linear dislocation array.

(Bonded Substrate Structure 15)

The GaN layer-bonded substrate according to any one of the bonded substrate structures 11 to 14, having a disk shape and having a flat portion provided on a part of the side surface, wherein the flat portion is orthogonal to the extending direction of the linear dislocation array.

(Bonded Substrate Structure 16)

The GaN layer-bonded substrate according to any one of the bonded substrate structures 11 to 14, having a disk shape and having a flat portion provided on a part of the side surface, wherein the flat portion is parallel to the extending direction of the linear dislocation array.

(Bonded Substrate Structure 17)

The GaN layer-bonded substrate according to any one of the bonded substrate structures 1 to 16, wherein in the GaN layer, any alkali or alkaline-earth metal has a concentration of less than $1\times10^{16}$ atoms/cm$^3$.

(Bonded Substrate Structure 18)

The GaN layer-bonded substrate according to any one of the bonded substrate structures 1 to 17, wherein in the GaN layer, any halogen in the GaN layer has a concentration of less than $1\times10^{16}$ atoms/cm$^3$.

(Bonded Substrate Structure 19)

The GaN layer-bonded substrate according to any one of the bonded substrate structures 1 to 18, wherein the GaN layer contains hydrogen (H) at a concentration of $10^{17}$ atoms/cm$^3$ order or higher.

(Bonded Substrate Structure 20)

The GaN layer-bonded substrate according to any one of the bonded substrate structures 1 to 19, wherein a peak attributable to a gallium vacancy-hydrogen complex is observed within a range from 3,100 to 3,500 cm$^{-1}$ in the infrared absorption spectrum of the GaN layer.

4. Fourth Embodiment

A fourth embodiment of the present invention relates to a method for producing a GaN single crystal.

The method for producing a GaN single crystal according to the fourth embodiment includes the steps of:

(S1) preparing a seed having a nitrogen polar surface of GaN;

(S2) forming a pattern mask on the nitrogen polar surface of the prepared seed, the pattern mask having a plurality of linear openings arranged parallel to each other at a constant pitch; and (S3) growing GaN crystals on the nitrogen polar surface through the linear openings of the pattern mask by an ammonothermal method.

The nitrogen polar surface of GaN of the seed prepared in the step (S1) may be parallel to the (000-1) or slightly tilted therefrom.

In the pattern mask formed in the step (S2), the extending direction of the linear openings forms an angle within a range of preferably 12°±5° with one of intersection lines between the nitrogen polar surface of the seed and the M-planes. The angle may be in a range of 12°±3°, 12°±2°, or 12°±1°.

In the step (S3), GaN crystals are grown from inside the openings of the pattern mask, then spread laterally over the pattern mask, and coalesce with each other while forming voids between the pattern mask and the crystals.

Hereinafter, the method of producing a GaN single crystal of the fourth embodiment will be described step by step.

4.1. Step of Preparing Seed

The GaN crystal constituting the seed used in the method of producing a GaN single crystal according to the fourth embodiment may be grown by any method, and examples of the crystal may be, but are not limited to, those grown by HVPE methods, flux methods, ammonothermal methods, or high pressure nitrogen methods.

When the GaN crystal for the seed is produced by a HVPE method, a technique such as DEEP (epitaxial-growth with inverse-pyramidal pits) [K. Motoki et al., Journal of Crystal Growth 237-239 (2002) 912], and VAS (Void-Assisted Separation) [Y. Oshima et al., Japanese Journal of Applied Physics 42 (2003) L1] may be used appropriately. When Advanced-DEEP [K. Motoki et al., Journal of Crystal Growth 305 (2007) 377] is used, the extension direction (in case of stripe core) or the arrangement direction (in case of dot core) of core (domain with reversed polarity) formed in a GaN crystal to be grown is preferably made aligned with the extending direction of linear openings to be provided in a pattern mask in a later step.

Since details of techniques necessary for slicing a GaN crystal, planarizing the cut face thereof, removing a damaged layer from the cut face, or the like which are required for fabricating the seed are well known to those skilled in the art, they may not be explained specifically. The nitrogen polar surface is planarized and made free of a damaged layer preferably through finishing by CMP (Chemical Mechanical Polishing).

The nitrogen polar surface may be parallel to the (000-1) or slightly tilted therefrom. The tilt of the nitrogen polar surface from the (000-1) is usually 10° or less, preferably 5° or less, more preferably 2° or less, more preferably 1° or less. In a preferred embodiment, the seed may be a C-plane GaN wafer.

4.2. Step of Forming Pattern Mask

In this step, a pattern mask, which is to limit an area where GaN can be grown, is formed on the nitrogen polar surface of GaN of the seed prepared in the previous step.

Material of the pattern mask is not limited so long as it does not dissolve or decompose during the growth of the GaN crystal by an ammonothermal method, and examples of the material include a single substance or an alloy of Ca, Mg, Si, Al, W, Mo, Ti, Pt, Ir, Ag, Au, Ta, Ru, Nb or Pd, and an oxide, a nitride, and a fluoride thereof.

The pattern mask is provided with a plurality of linear openings parallel to each other at regular intervals. In other words, the pattern mask is provided with the plurality of linear openings parallel to each other at a constant pitch.

An example of the mask will be described with reference to FIGS. 7A and 7B and FIG. 8.

Figures 7A, 7B:
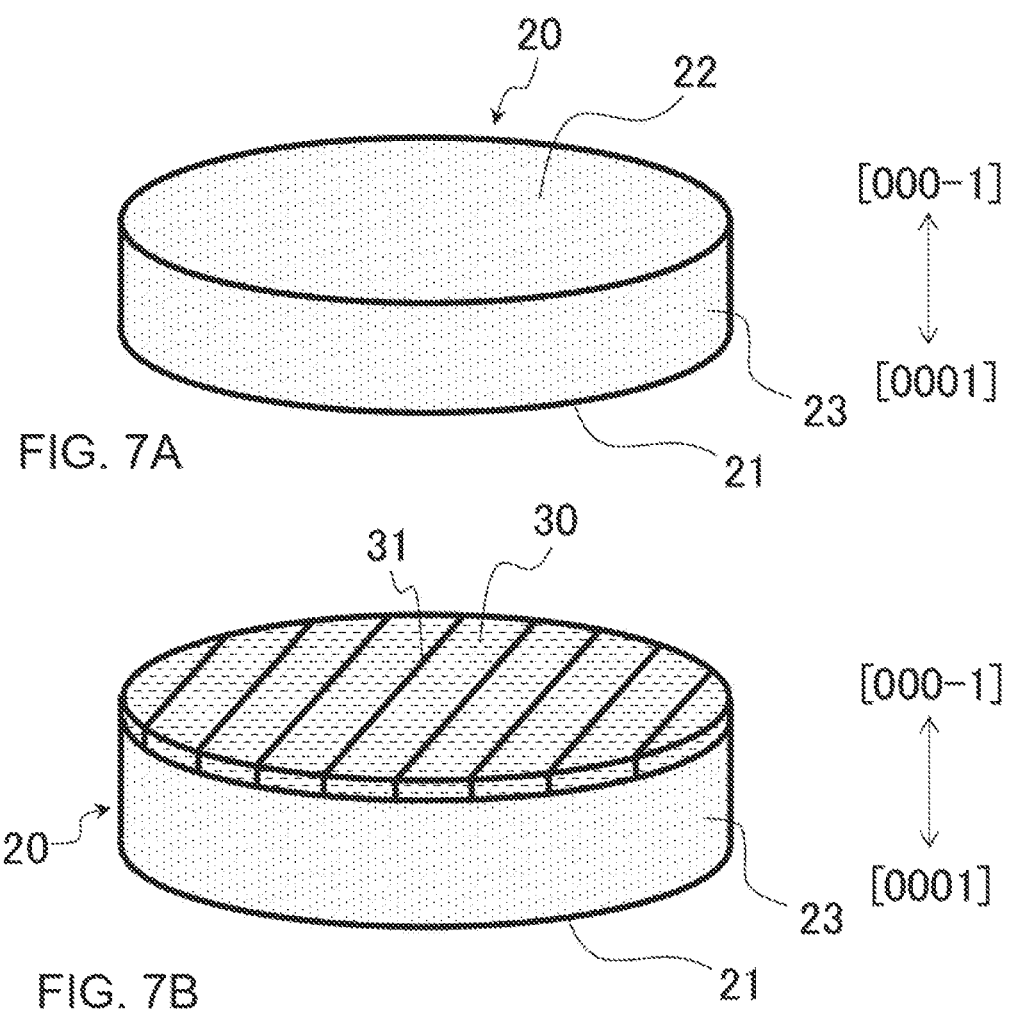
FIGS. 7A and 7B are perspective views illustrating an example of a seed.

FIG. 7A is a perspective view illustrating an example of the seed. The seed 20 is a disc-shaped C-plane GaN wafer, which has a gallium polar surface 21, a nitrogen polar surface 22, and a side surface 23. FIG. 7B is a perspective view illustrating a state where a stripe type pattern mask 30 having a plurality of linear openings 31 extending in the same direction is formed on the nitrogen polar surface 22 of the seed 20 of FIG. 7A.

Figure 8:
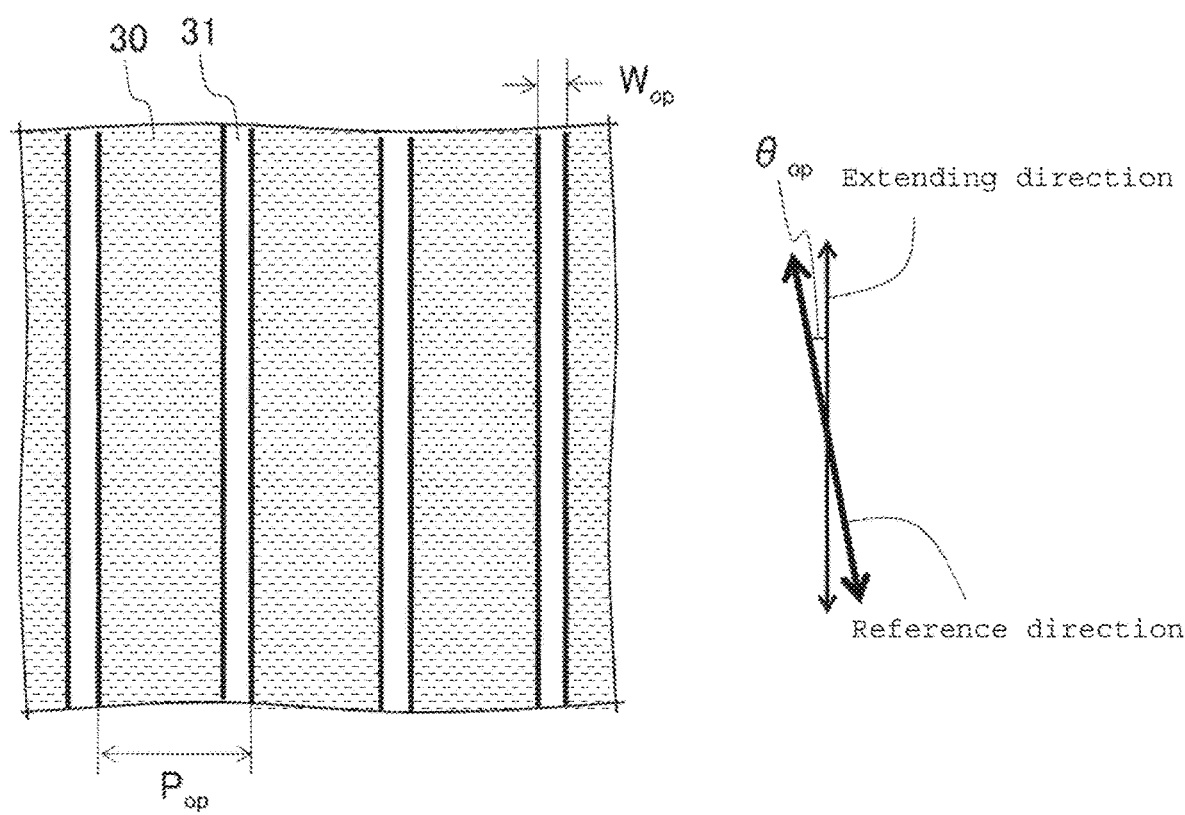
FIG. 8 is a plan view illustrating a pattern mask of a stripe type.

FIG. 8 is a plan view illustrating only the stripe type pattern mask 30.

As seen from FIG. 8, the width $W_{op}$ of the linear openings 31 is usually 5 μm or more, preferably 10 μm or more, more preferably 20 μm or more, and is usually 500 μm or less, preferably 200 μm or less, more preferably 100 μm or less.

The pitch $P_{op}$ between the linear openings 31 is usually 3 mm or more, preferably 3.5 mm or more, more preferably 4 mm or more, and usually 20 mm or less. The pitch $P_{op}$ between the linear openings 31 may be 10.5 mm or less, 7.5 mm or less, or 5.5 mm or less.

When an extending direction of one of intersection lines between the nitrogen polar surface and the M-planes is selected as a reference direction, an angle $\theta_{op}$ formed between the extension direction of the linear openings 31 and the reference direction is preferably within a range of 12°±5°. The angle $\theta_{op}$ may be within a range of 12°±3°, 12°±2°, or 12°+1°.

When the angle $\theta_{op}$ is within the above-described preferable range, it becomes easier for GaN crystals growing through the linear openings to grow laterally over the pattern mask and coalesce with each other in a step of growing a GaN crystal by an ammonothermal method (described later).

Figure 9:
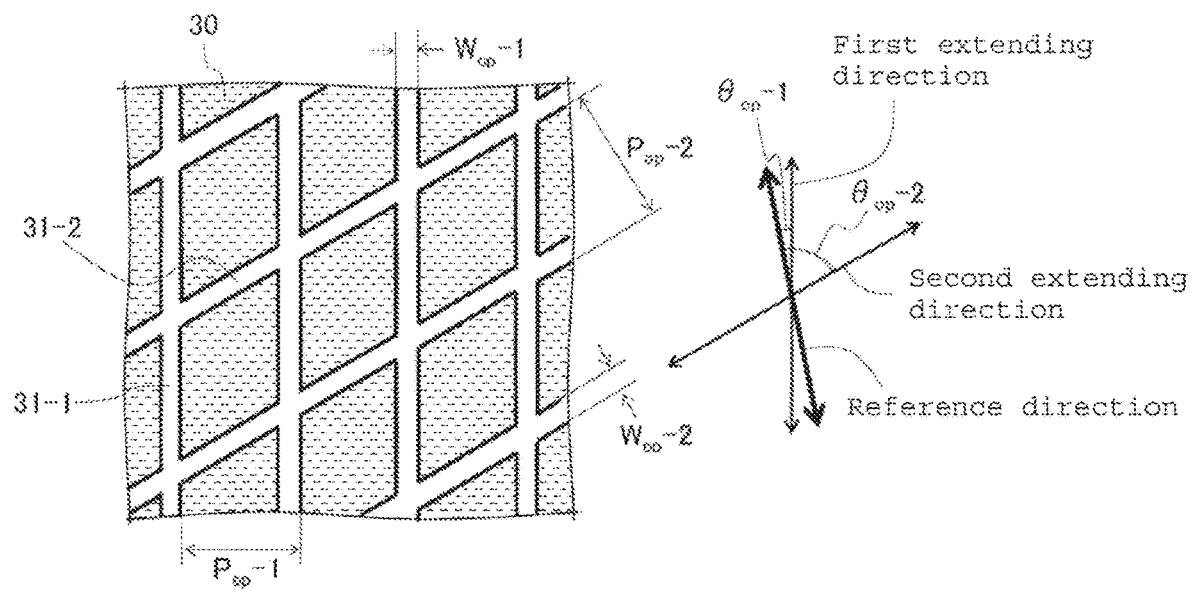
FIG. 9 is a plan view illustrating a pattern mask of a rhomboid grid type.

FIG. 9 is a plan view illustrating another pattern mask which may be formed on the nitrogen polar surface of the seed.

The pattern mask 30 illustrated in FIG. 9 is of a rhomboid grid type, and is provided with a plurality of first linear openings 31-1 extending along a first extending direction and a plurality of second linear openings 31-2 extending along a second extending direction. The pitch $P_{op}$-1 between the first linear openings 31-1 and the pitch $P_{op}$-2 between the second linear openings 31-2 are each constant.

Both the width $W_{op}$-1 of the first linear openings 31-1 and the width $W_{op}$-2 of the second linear openings are usually 5 μm or more, preferably 10 μm or more, more preferably 20 μm or more, and usually 500 μm or less, preferably 200 μm or less, more preferably 100 μm or less.

The pitch $P_{op}$-1 between the first linear openings 31-1 is usually 3 mm or more, preferably 3.5 mm or more, more preferably 4 mm or more, and usually 20 mm or less. The pitch $P_{op}$-2 between the second linear openings 31-2 is usually 3 mm or more, preferably 6 mm or more, more preferably 9 mm or more, and is usually 20 mm or less.

When an extending direction of one of intersection lines between the nitrogen polar surface and the M-planes is selected as a reference direction, the angle $\theta_{op}$-1 formed between the first extending direction and the reference direction is preferably within a range of 12°±5°. The angle $\theta_{op}$-1 may be within a range of 12°±3°, 12°±2°, or 12°+1°.

The angle $\theta_{op}$-2 formed between the second extending direction and the above-described reference direction is preferably in a range of 72°±5°. The angle $\theta_{op}$-2 may be within a range of 72°±3°, 72°±2°, or 72°±1°. The angle between the first extending direction and the second extending direction may be 60°.

When the angles $\theta_{op}$-1 and $\theta_{op}$-2 are each within the above-described preferable ranges, it becomes easier for GaN crystals growing through the first linear openings and the second linear openings to grow laterally over the pattern mask and coalesce with each other in a step of growing a GaN crystal by an ammonothermal method (described later).

Figure 10:
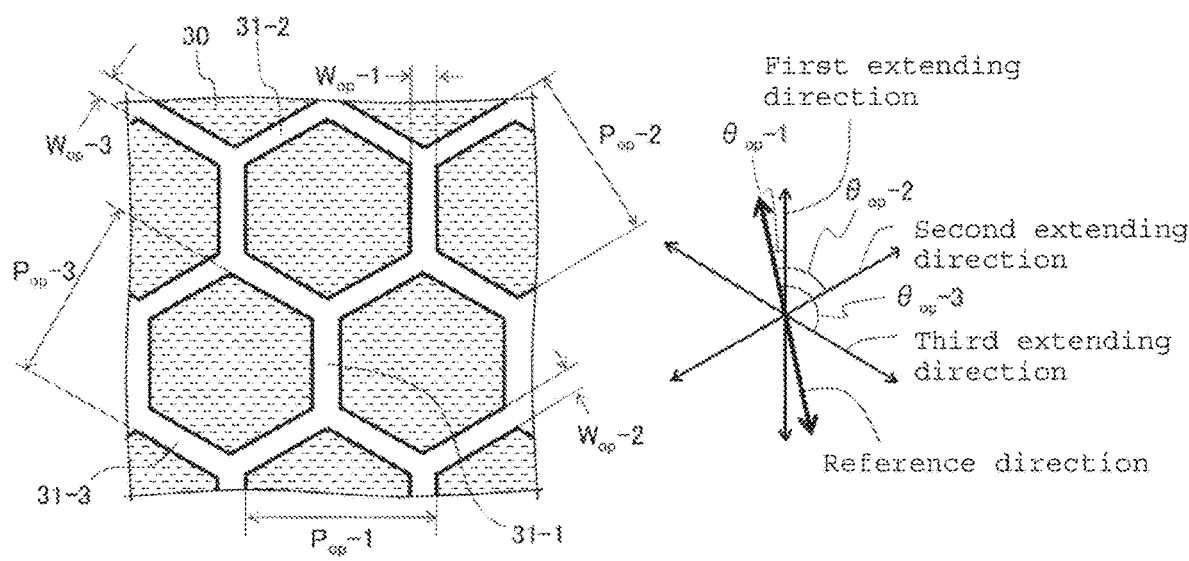
FIG. 10 is a plan view illustrating a pattern mask of a hexagonal grid type.

FIG. 10 is a plan view illustrating still another pattern mask that may be formed on the nitrogen polar surface of the seed.

The pattern mask 30 illustrated in FIG. 10 is of a hexagonal grid type, and is provided with a plurality of first linear openings 31-1 extending along a first extending direction, a plurality of second linear openings 31-2 extending along a second extending direction, and third linear openings 31-3 extending along a third extending direction. The pitch $P_{op}$-1 between the first linear openings 31-1, the pitch $P_{op}$-2 between the second linear openings 31-2, and the pitch $P_{op}$-3 between the third linear openings 31-3 are each constant.

The width $W_{op}$-1 of the first linear openings 31-1, the width $W_{op}$-2 of the second linear openings, and the width $W_{op}$-3 of the third linear openings are all usually 5 μm or more, preferably 10 μm or more, more preferably 20 μm or more, and are usually 500 μm or less, preferably 200 μm or less, and more preferably 100 μm or less.

The pitch $P_{op}$-1 between the first linear openings 31-1, the pitch $P_{op}$-2 between the second linear openings 31-2, and the pitch $P_{op}$-3 between the third linear openings 31-3 are all usually 4 mm or more, preferably 5 mm or more, more preferably 6 mm or more, and usually 20 mm or less.

When an extending direction of one of intersection lines between the nitrogen polar surface and the M-planes is selected as a reference direction, the angle $\theta_{op}$-1 formed between the first extending direction and the reference direction is preferably within a range of 12°±5°. The angle $\theta_{op}$-1 may be within a range of 12°±3°, 12°±2°, or 12°+1°.

The angle $\theta_{op}$-2 formed between the second extending direction and the above-described reference direction is preferably within a range of 72°±5°. The angle $\theta_{op}$-2 may be within a range of 72°±3°, 72°±2°, or 72°±1°. The angle between the first extending direction and the second extending direction may be 60°.

The angle $\theta_{op}$-3 formed between the third extending direction and the above-described reference direction is preferably within a range of 132°±5°. The angle $\theta_{op}$-3 may be within a range of 132°±3°, 132°±2°, or 132°±1°. The angle between the first extending direction and the third extending direction may be 120°.

When the angles $\theta_{op}$-1, $\theta_{op}$-2, and $\theta_{op}$-3 are within the above-described preferable ranges, it becomes easier for GaN crystals growing through the first linear openings, the second linear openings, and the third linear openings, to grow laterally over the pattern mask and coalesce with each other in a step of growing a GaN crystal by an ammonothermal method (described later).

4.3. Step of Growing GaN Crystal by Ammonothermal Method

In this step, a GaN crystal is grown, by an ammonothermal method, on the nitrogen polar surface of the seed provided with the pattern mask formed in the previous step.

FIGS. 11A, 11B, 11C, 11D, and 11E are cross-sectional views illustrating the growth of the GaN crystal.

Figure 11A:
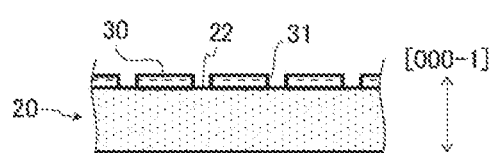
FIGS. 11A, 11B, 11C, 11D, and 11E are cross-sectional views illustrating growth of a GaN crystal on a nitrogen polar surface of GaN of a seed.

FIG. 11A illustrates a state before the growth of GaN crystals, where a pattern mask 30 is formed on a nitrogen polar surface 22 of a seed 20, the pattern mask having linear openings 31 extending in the direction perpendicular to the plane of paper.

Figure 11B:
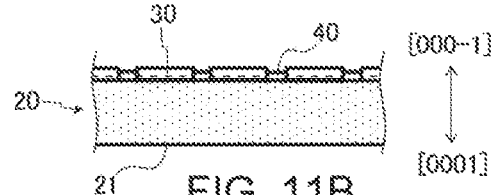

FIG. 11B illustrates GaN crystals 40 at the beginning of their growth inside the linear openings 31 of the pattern mask 30.

Figure 11C:
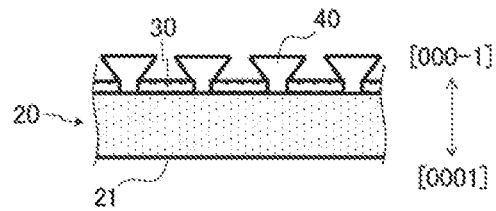

After passing through the linear openings 31 of the pattern mask 30, the GaN crystals 40 grow not only in the [000-1] direction but also in a lateral direction (a direction parallel to the nitrogen polar surface 22), as illustrated in FIG. 11C.

Figure 11D:
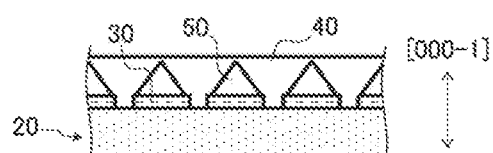

Eventually, the GaN crystals 40 coalesce with each other above the pattern mask 30, and their growth fronts forms one plane, as illustrated in FIG. 11D. Any GaN crystal growing through the linear opening usually grows by 1 mm or more in the [000-1] direction until it comes in contact with other GaN crystals growing through the adjacent linear openings and starts to coalesce with them. Therefore, voids 50 are formed between the pattern mask 30 and the GaN crystal 40. The size of the voids 50 in the c-axis direction, i.e., the distance from the surface (nitrogen polar surface) of the seed 20 to the coalescence points of the GaN crystal 40 is 1 mm or more.

Since the contact between the GaN crystal and the pattern mask is reduced in this growth mode, the pattern mask less affects the crystallinity of the GaN crystal.

Since the pitch of the linear openings 31 is usually 3 mm or more, the total area of the interface between the GaN crystals 40 and the seed 20 is small, propagation of dislocation defects from the seed to the GaNs crystal is inhibited.

Figure 11E:
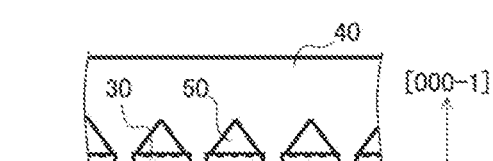

After the coalescence, the GaN crystal 40 is further grown in the [000-1] direction, as illustrated in FIG. 11E.

Note that the growth of the GaN crystal on the gallium polar surface is omitted in FIGS. 11A, 11B, 11C, 11D, and 11E although it also occurs.

Figure 12:
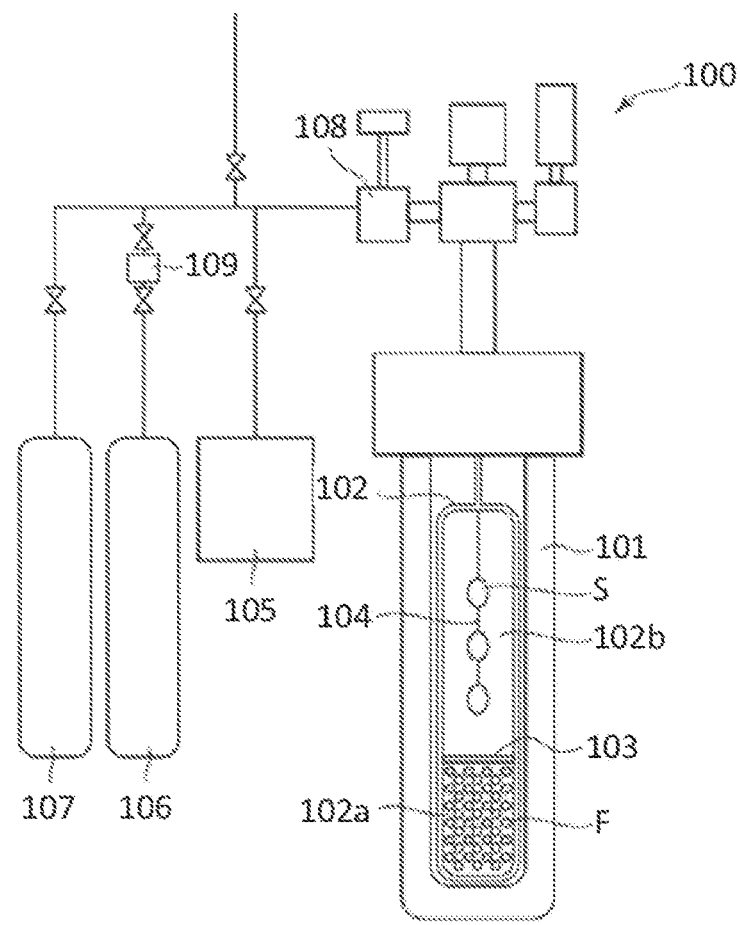
FIG. 12 illustrates a crystal growth apparatus that may be used for growing a GaN crystal by an ammonothermal method.

A crystal growth apparatus 100 illustrated in FIG. 12 may be used for growing the GaN crystal by an ammonothermal method. The crystal growth apparatus 100 is provided with a cylindrical autoclave 101 and a cylindrical growth vessel 102 placed in the autoclave.

The growth vessel 102 has therein a feedstock dissolution zone 102a and a crystal growth zone 102b which are partitioned from each other with a baffle 103. A feedstock F is placed in the feedstock dissolution zone 102a. In the crystal growth zone 102b, a seed (C-plane GaN wafer) S is placed, hung by a platinum wire 104.

A gas line to which a vacuum pump 105, an ammonia cylinder 106, and a nitrogen cylinder 107 are connected is connected to the autoclave 101 and the growth vessel 102 via a valve 108. When ammonia is introduced into the growth vessel 102, its amount supplied from the ammonia cylinder 106 can be checked by a mass flow meter 109.

The feedstock is a single-crystalline or polycrystalline GaN which is powdery, granular, or bulky. The amount of an impurity such as water and oxygen contained in ammonia used for a solvent is preferably 0.1 ppm or less.

A mineralizer is used to promote dissolution of the feedstock. As the mineralizer, ammonium fluoride ($NH_4F$) and ammonium iodide ($NH_4I$) are preferably used in combination. The ammonium fluoride may be one obtained by reacting ammonia and hydrogen fluoride (HF) in the growth vessel. Similarly, the ammonium iodide may be one obtained by reacting ammonia and hydrogen iodide (HI) in the growth vessel.

When the temperature inside the growth vessel is within a specific temperature range containing 550 to 650° C., using only ammonium fluoride as a mineralizer causes a negative temperature dependence of the solubility of GaN, leading to difficulty in control. This problem can be solved by using ammonium iodide in combination. Ammonium chloride and ammonium bromide are also similarly effective.

When the temperature inside the growth vessel is within the above specified temperature range, it is not recommended to use only ammonium halide selected from ammonium chloride, ammonium bromide, and ammonium iodide, as a mineralizer. When these mineralizer are used without ammonium fluoride, the GaN crystal grows substantially only in the [000-1] direction and hardly in the lateral direction within this temperature range.

When ammonium fluoride is used singly as a mineralizer, it becomes difficult for voids to be formed between the GaN crystal and the pattern mask because the lateral growth is strongly promoted. This tendency becomes significant when the growth rate in the [000-1] direction is lowered to less than 100 µm/day.

When the GaN crystal is grown on the seed S, ammonia is introduced also in a space between the autoclave 101 and the growth vessel 102, and a supercritical or subcritical state is created inside the growth vessel 102 by heating it from the outside of the autoclave with a heater (not illustrated).

A successful coalescence between the GaN crystals over the pattern mask is achieved, for example, by setting the amounts of ammonium fluoride and ammonium iodide to be 0.5% and 4.0%, respectively, in terms of molar ratio to ammonia used as a solvent, the pressure inside the growth vessel to be about 220 MPa, the average value of a temperature Ts in the feedstock dissolution zone and a temperature Tg in the crystal growth zone to be about 600° C., and the temperature difference Ts−Tg between these two zones to be about 5° C. (Ts>Tg).

After the coalescence, the GaN crystal is further grown under the same condition or under a condition altered such that the growth rate of GaN in the [000-1] direction becomes higher than that before the coalescence.

In the step of growing the GaN crystal by an ammonothermal method, the growth vessel may be exchanged whenever the feedstock is exhausted, to repeat regrowth of the crystal.

The above procedures can provide a plate-like GaN single crystal the thickness direction of which is parallel or substantially parallel to the c-axis.

The GaN single crystal may be sliced in various directions to provide a GaN wafer. For example, by slicing it parallel to the C-plane, a C-plane GaN wafer can be obtained.

The obtained GaN wafer may be preferably used for producing semiconductor devices, and the like, and may also be used as a seed for growing bulk GaN crystals.

4.4. Miscellaneous

In the stripe-type pattern mask 30 illustrated in FIG. 8, the angle $\theta_{op}$ formed between the extending direction of the linear openings 31 and the reference direction (an extending direction of one of the intersection lines between the nitrogen polar surface and the M-planes) affects the ratio of the growth rate in the lateral direction to that in the [000-1] direction of the GaN crystals growing through the openings.

Simply speaking, when the angle $\theta_{op}$ is close to 0°, the growth in the [000-1] direction tends to be dominant, and conversely, when the angle $\theta_{op}$ is close to 30°, the growth in the lateral direction tends to be dominant.

Therefore, in order to grow the GaN crystals by 1 mm or more in the [000-1] direction before the starting of the coalescence, it is desirable not to increase the angle $\theta_{op}$ too much. Specifically, the angle $\theta_{op}$ is preferably less than 25°, more preferably less than 20°.

Although the angle $\theta_{op}$ may be less than 7°, respective GaN crystals growing through adjacent two among the linear openings arranged in parallel tend to be difficult to coalesce with each other when the angle $\theta_{op}$ approaches 0°.

What has been described above regarding the angle $\theta_{op}$ is also true for the angles $\theta_{op}$-1 and $\theta_{op}$-2 in the rhomboid grid type pattern mask 30 illustrated in FIG. 9 and the angles θ-1, $\theta_{op}$-2, and $\theta_{op}$-3 in the hexagonal grid type pattern mask illustrated in FIG. 10.

When the linear openings are arranged with a long pitch of 3 mm or more in the pattern mask, GaN crystals growing respectively through each of two adjacent linear openings arranged in parallel are difficult to coalesce with each other. In order to overcome such a tendency and increase the probability of occurrence of the coalescence, it is effective to lower the growth rate of the GaN crystal.

One of means for lowering the growth rate of the GaN crystal is to reduce the temperature difference between the feedstock dissolution zone and the crystal growth zone in the growth vessel.

In addition, using the pattern mask with a pattern of rhomboid grid type or hexagonal grid type is also effective to facilitate occurrence of the coalescence of the GaN crystals.

5. Experimental Results 5.1. Experiment 1
(1) Preparation of Seed

A C-plane GaN wafer made from a GaN crystal grown by an HVPE method was prepared as a seed (The seed is hereinafter referred to as "HVPE seed."). Both the nitrogen polar surface and the gallium polar surface of the HVPE seed were CMP-finished. The nitrogen polar surface was tilted from the (000-1) and its tilt angle was less than 1°.
(2) Formation of Pattern Mask A pattern mask of a stripe type was made on the nitrogen polar surface of the HVPE seed by a lift-off method, which mask was a laminated film composed of a 100 nm thick TiW layer and a 100 nm thick Pt layer laminated thereon, and had 50 μm wide linear openings with a pitch of 4 mm. The extending direction of the linear openings was tilted by 12° from one of intersection lines between the M-planes and the nitrogen polar surface in the HVPE seed.
(3) Growth of GaN Crystal by Ammonothermal Method A GaN crystal was grown by an ammonothermal method on the HVPE seed with the above-mentioned pattern mask formed thereon. Polycrystalline GaN (oxygen concentration: about $5 \times 10^{17}$ cm$^{-3}$) produced by a method of reacting ammonia and gallium chloride (GaCl) in a gas phase was used as a feedstock. Ammonium fluoride and ammonium iodide were used as mineralizers.

Amounts of ammonium fluoride and ammonium iodide were set to be 0.5% and 4.0%, respectively, in terms of molar ratio to ammonia to be introduced into the growth vessel. Ammonium iodide was produced by introducing hydrogen iodide (HI) into the growth vessel after introducing ammonia.

Growth conditions were as follows: the average value of the temperature Tg in the crystal growth zone and the temperature Ts in the feedstock dissolution zone was 598° C.; the temperature difference between the crystal growth zone and the feedstock dissolution zone was 5° C. (Ts>Tg); and the pressure inside the growth vessel was 220 MPa.

After 35 days from the beginning of growth, the growth vessel was opened, and the grown GaN crystal was taken out to be observed.

On the nitrogen polar surface side of the HVPE seed, the GaN was grown by 1.1 mm in the [000-1] direction. Accordingly, the growth rate was 31 μm/day.

The growth front of the GaN crystal had passed through the linear openings and reached above the pattern mask, but the lateral growth rate was not uniform on the surface, and coalescence had not yet begun on most part of the surface although it had already begun on a part of the surface.

After the observation, the GaN crystal was transferred into a newly prepared growth vessel, and regrowth was performed under the same ammonothermal growth conditions. After 35 days from the beginning of the regrowth, the growth vessel was opened and the GaN crystal was taken out.

During the regrowth, the GaN crystal completely coalesced and the growth front was flattened.

The growth amount of GaN in the [000-1] direction in the regrowth was 3.6 mm. Accordingly, the growth rate was 103 μm/day. In total, the GaN crystal was grown by about 4.7 mm in the [000-1] direction in 70 days.

V-shaped trenches were observed on the [0001] side of the ammonothermally grown GaN crystal.

More specifically, the observation of the surface on the [0001] side (the side having bonded to the seed) of the grown GaN crystal separated from the seed revealed that a plurality of V-grooves parallel to each other were formed at regular intervals.

The direction of the V-grooves was parallel to the linear openings of the pattern mask provided on the seed surface before crystal growth, and the pitch between the V-grooves was the same as that between the linear openings. This means that the GaN crystal grew in the manner illustrated in FIGS. 11A, 11B, 11C, 11D, and 11E and that the traces of the resultant voids were the V-grooves, in other words, that the side surface of the V-grooves was a part of the inner surface of the voids.

Figure 13:
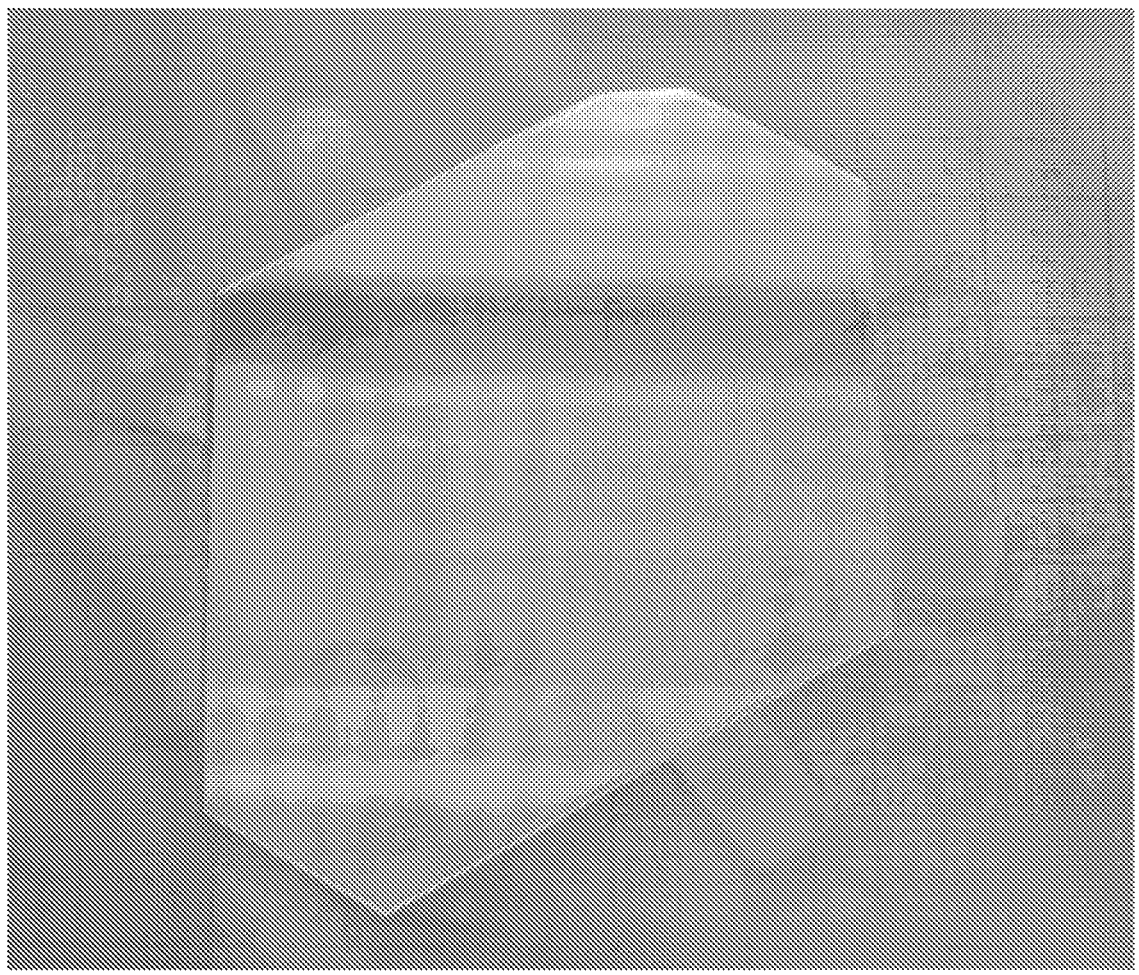
FIG. 13 is a photograph illustrating an appearance of a C-plane GaN wafer.

The depth of the V-grooves measured with a laser microscope was 1.9 mm at the deepest part. This observation result, combined with that before the regrowth, suggested that coalescence began to occur in the GaN crystal when it grew by 1 to 2 mm in the [000-1] direction.
(4) Processing for Making Wafer The GaN single crystal grown by the ammonothermal method was sliced parallel to the C-plane to obtain a plurality of blank wafers. FIG. 13 illustrates a photograph of the appearance of a double-side polished C-plane GaN wafer of 350 μm in thickness fabricated by processing one of the blank wafers.

In the C-plane GaN wafer illustrated in FIG. 13, both the gallium polar surface and the nitrogen polar surface were CMP-finished, but a damaged layer on the nitrogen polar surface may be removed also by alkaline etching. The alkaline-etched nitrogen polar surface is a mat surface on which fine cones are densely formed.
(5) Evaluation of Wafer
<EPD>

The C-plane GaN wafer prepared by the above-described procedure was etched for one hour with 89% sulfuric acid heated to 270° C. After the etching, the gallium polar surface of the C-plane GaN wafer was observed using an optical microscope (ECLIPSE LV100 from Nikon Corporation).

A certain square area of 2 mm×2 mm on the gallium polar surface was divided into 400 sub-areas each of which was a 100 μm×100 μm square, and the number of etch pits contained in each of the sub-areas was investigated. As a result, 372 sub-areas corresponding to 93% of the 400 sub-areas were pit-free (EPD=0 cm$^{-2}$). In a sub-area having the highest EPD out of 28 sub-areas where etch pits were found, the EPD was $1.1 \times 10^5$ cm$^{-2}$. The average value of EPDs across the 400 sub-areas was $1.7 \times 10^3$ cm$^{-2}$.

Further, a certain square area of 3 mm×3 mm encompassing the 2 mm×2 mm square area described above was divided into 900 sub-areas each of which was a 100 μm×100 μm square, and the number of etch pits contained in each of the sub-areas was investigated. As a result, 829 sub-areas corresponding to 92% of the 900 sub-areas were pit-free (EPD=0 cm$^{-2}$). In a sub-area having the highest EPD out of 71 sub-areas where etch pits were found, the EPD was $1.5 \times 10^5$ cm$^{-2}$. The average value of EPDs across the 900 sub-areas was $2.0 \times 10^3$ cm$^{-2}$.

Further, a certain square area of 3.5 mm×3.5 mm encompassing the 3 mm×3 mm square area described above was divided into 1,225 sub-areas each of which was a 100 μm×100 μm square, and the number of etch pits contained in each of the sub-areas was investigated. As a result, 1,141 sub-areas corresponding to 93% of the 1,225 sub-areas were pit-free (EPD=0 cm$^{-2}$). In a sub-area having the highest EPD out of 84 sub-areas where etch pits were found, the EPD was $1.5 \times 10^5$ cm$^{-2}$. The average value of EPDs across the 1,225 sub-areas was $1.9 \times 10^3$ cm$^{-2}$.

This 3.5 mm×3.5 mm square area overlapped with no linear etch pit array to be described later.

Further, a certain square area of 4 mm×4 mm encompassing the 3.5 mm×3.5 mm square area described above was divided into 1,600 sub-areas each of which was a 100 μm×100 μm square, and the number of etch pits contained in each of the sub-areas was investigated. As a result, 1,395 sub-areas corresponding to 87% of the 1,600 sub-areas were pit-free (EPD=0 cm$^{-2}$). In a sub-area having the highest EPD out of 205 sub-areas where etch pits were found, the EPD was $2.0 \times 10^5$ cm$^{-2}$. The average value of EPDs across the 1,600 sub-areas was $8.3 \times 10^3$ cm$^{-2}$.

This 4 mm×4 mm square area overlapped with a part of linear etch pit arrays to be described later. On the other hand, a pit free 1.3 mm×1.3 mm area was also observed in the 4 mm×4 mm square area.

Further, a certain square area of 5 mm×5 mm encompassing the 4 mm×4 mm square area was divided into 2,500 sub-areas each of which was a 100 μm×100 μm square, and the number of etch pits contained in each of the sub-areas was investigated. As a result, 2,210 sub-areas corresponding to 88% of the 2,500 sub-areas were pit-free (EPD=0 cm$^{-2}$). In a sub-area having the highest EPD out of 290 sub-areas where etch pits were found, the EPD was $2.0 \times 10^5$ cm$^{-2}$. The average value of EPDs across the 2,500 sub-areas was $7.2 \times 10^3$ cm$^{-2}$.

Figure 14:
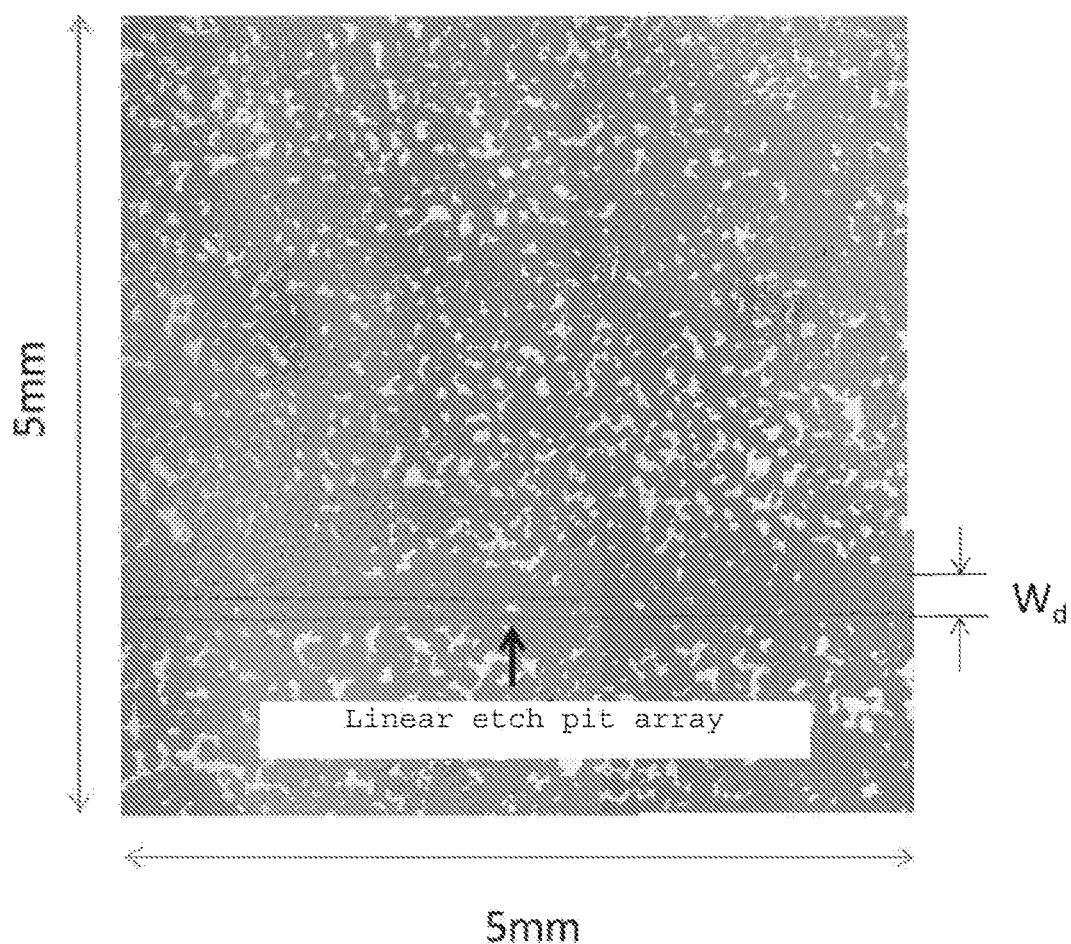
FIG. 14 is an optical microscopic image of a gallium polar surface of a C-plane GaN wafer etched for one hour with 89% sulfuric acid heated to 270° C.

FIG. 14 is an optical microscopic image of the above-described square area of 5 mm×5 mm. A pattern in which white portions and gray portions are complicatedly mixed is seen because the nitrogen polar surface was roughened by the etching treatment described above.

As illustrated in FIG. 14, a linear etch pit array having a width $W_d$ of 260 to 270 μm was observed in this 5 mm×5 mm square area. In the C-plane GaN wafer fabricated in Experiment 1, such linear etch pit arrays were formed with a pitch of 4 mm on the whole gallium polar surface.

The extending direction of the linear etch pit arrays coincided with the extending direction of the linear openings in the pattern mask provided on the HVPE seed. On the other hand, the positions of the linear etch pit arrays and those of the linear openings were displaced by 2 mm with each other in a direction orthogonal to the extending direction. This suggests that linear dislocation arrays parallel to the linear openings were formed when GaN crystals growing on the nitrogen polar surface of the HVPE seed coalesced with each other over the pattern mask.

In the square area of 5 mm×5 mm illustrated in FIG. 14, the number of etch pits contained in one sub-area (100 μm×100 μm) was at most 20 even in a region overlapping with the linear etch pit array. In other words, the density of etch pits constituting the linear etch pit arrays was at most $2 \times 10^5$ cm$^{-2}$. When a band-like area of 5 mm in length and 200 μm in width, which wholly overlapped with the linear etch pit array, was investigated, the average value of EPDs across 100 sub-areas in the band-like area was $1.2 \times 10^5$ cm$^{-2}$.

Another wafer out of the plurality of blank wafers obtained in the above-described section 5.1.(4) was processed to fabricate a 350 μm thick C-plane GaN wafer. The wafer was then etched for 2 hours with 89% sulfuric acid heated to 270° C., followed by observing a part of its gallium polar surface (4×7 mm$^2$) using an optical microscope. As a result, a rectangular pit-free area of 1.62 mm×1.88 mm and a rectangular pit-free area of 1.47 mm×1.92 mm were able to be found. The distance between the two pit-free areas was about 0.5 mm.

<X-Ray Topography>

Figure 15:
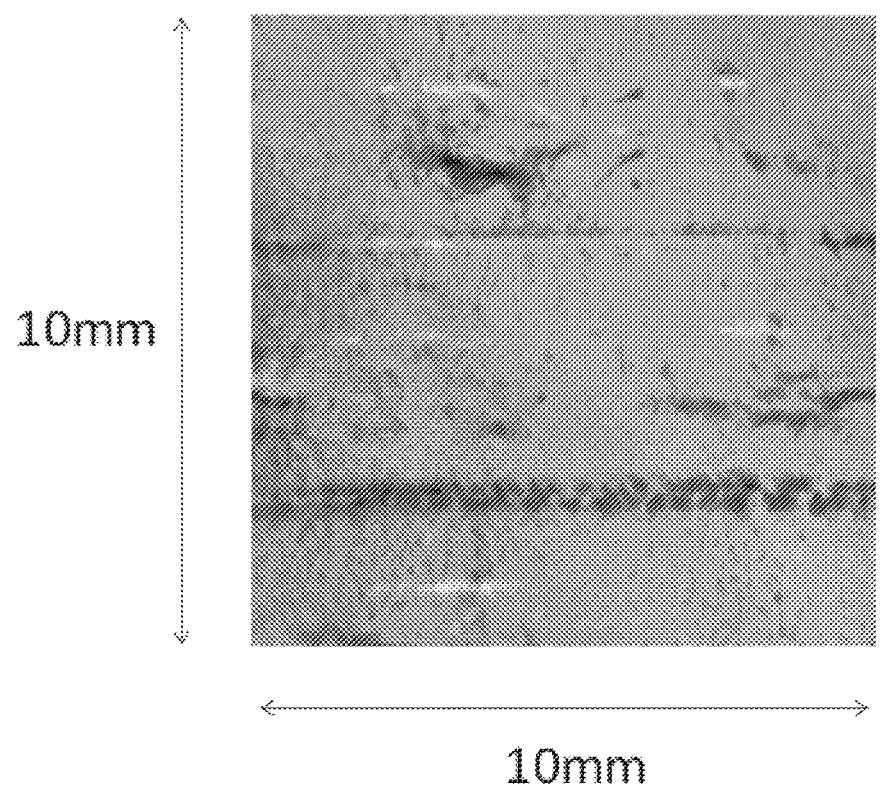
FIG. 15 is a transmission X-ray topography image of a C-plane GaN wafer.

An X-ray topography analysis of the C-plane GaN wafer fabricated in Experiment 1 was carried out using an X-ray diffractometer (XRT-300 from Rigaku Corporation). FIG. 15A illustrates a transmission X-ray topographic image obtained using the (11-20) diffraction. An X-ray source used was MoKα and the thickness of the sample was 350 μm, resulting in μ·t=10.2. Accordingly, the X-ray topographic image in FIG. 15 is an anomalous transmission image.

A transmission X-ray topographic image was able to be obtained in any part of the C-plane GaN wafer produced in Experiment 1.

<XRC-FWHM of (002) Reflection>

XRC-FWHMs of the (002) reflection of the C-plane GaN wafer produced in Experiment 1 were measured using an X-ray diffractometer [PANalytical X'pert PRO MRD from Spectris Co., Ltd.]. A Ge (220) 2-crystal monochromator was used in an incident optical system of the X-ray diffraction apparatus.

The beam size of the X-ray on the specimen surface was set so as to be 0.2 mm×3 mm when the incident angle of the X-ray was 90° (the incident direction of the X-ray orthogonal to the specimen surface). At the time of measurement, the direction in which the beam size was 3 mm was kept orthogonal to the X-ray incidence plane. The incidence plane means a plane which is perpendicular to the reflection plane and contains the incident beam and the reflected beam.

Figure 16:
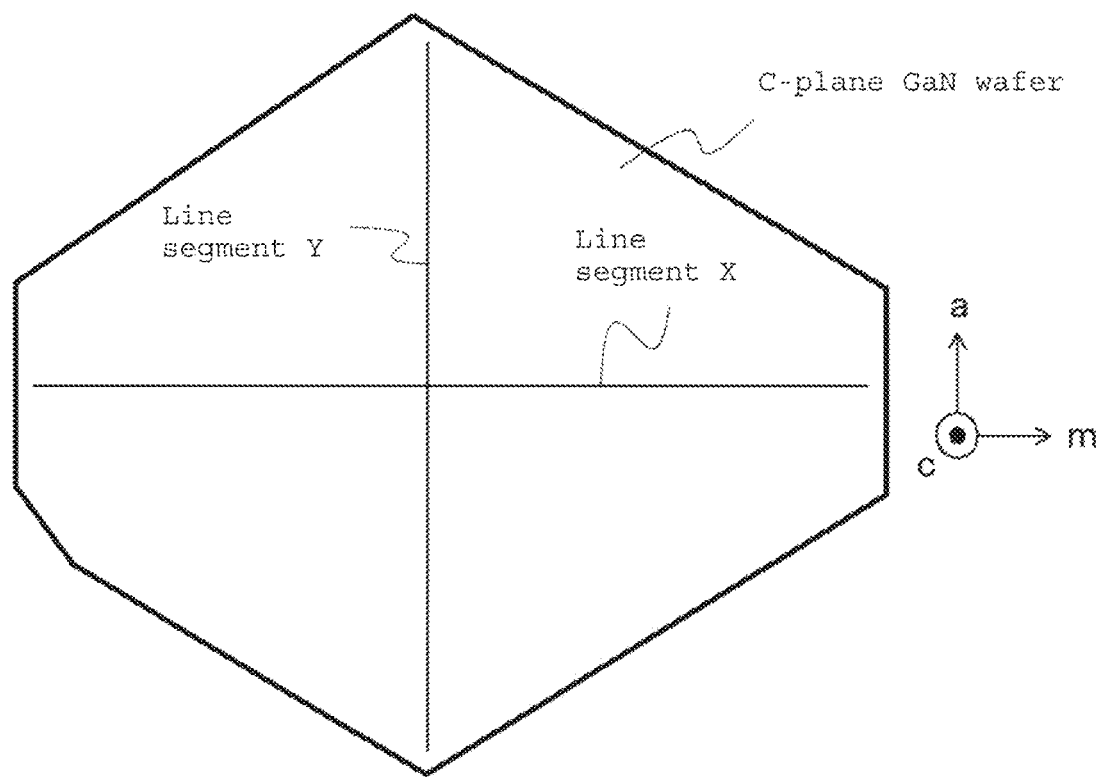
FIG. 16 is a plan view of a C-plane GaN wafer for illustrating measurement directions of XRC-FWHMs.

Measurements were made at 0.2 mm intervals on a virtual line segment X parallel to the m-axis and a virtual line segment Y parallel to the a-axis, each of the line segments passing through an approximate center of the gallium polar surface illustrated in FIG. 16. In other words, an XRC was obtained by performing an ω scan at each of a plurality of measurement points arranged with 0.2 mm intervals on each of the line segments, and its FWHM was calculated.

The X-ray incidence plane in the ω scan at each of the measurement points on the line segment X was kept parallel to the line segment X. The X-ray incidence plane in the ω scan at each of the measurement points on the line segment Y was kept parallel to the line segment Y.

The length of the line segment X exceeded 90% of the size of the gallium polar surface in the m-axis direction. The length of the line segment Y exceeded 90% of the size of the gallium polar surface in the a-axis direction.

As a result of measurements over 69 mm on the line segment X parallel to the m-axis, it was at one point out of 346 measurement points where the XRC-FWHM was 40 arcsec or more, and the XRC-FWHMs fell below 40 arcsec at 345 points corresponding to approximately 100% of all the measurement points.

On the line segment X, there was a section of 64 mm in length where the XRC-FWHMs fell below 40 arcsec at all the measurement points within the section.

It was at 7 points out of 346 measurement points where the XRC-FWHMs were 30 arcsec or more, and the XRC-FWHMs fell below 30 arcsec at 339 points corresponding to 98% of all the measurement points.

On the line segment X, there was a section 35.2 mm in length where the XRC-FWHMs fell below 30 arcsec at all the measurement points within the section.

As a result of measurements over 54.6 mm on the line segment Y parallel to the a-axis, it was at one point out of 274 measurement points where the XRC-FWHM was 40 arcsec or more, and the XRC-FWHMs fell below 40 arcsec at 273 points corresponding to approximately 100% of all the measurement points.

On the line segment Y, there was a section of 49.6 mm in length where the XRC-FWHMs fell below 40 arcsec at all the measurement points within the section.

It was at 11 points out of 274 measurement points that the XRC-FWHMs were 30 arcsec or more, and the XRC-FWHMs fell below 30 arcsec at 263 points corresponding to 96% of all the measurement points.

On the line segment Y, there was a section of 26.4 mm in length where the XRC-FWHMs fell below 30 arcsec at 131 points corresponding to 98% of 133 measurement points within the section.

<XRC-FWHM of (004) Reflection>

XRC-FWHMs of the (004) reflection of the C-plane GaN wafer produced in Experiment 1 were measured using an X-ray diffraction apparatus [PANalytical X'pert PRO MRD from Spectris Co., Ltd.]. An X-ray mirror and a Ge (440) 4-crystal monochromator were used in an incident optical system. The resolution of the optical system was 5 to 6 arcsec. The beam size of the X-ray on the specimen surface was set so as to be 0.2 mm×5 mm when the incident angle of the X-ray was 90° (the incident direction of the X-ray orthogonal to the sample surface). At the time of measurement, the direction in which the beam size was 5 mm was kept orthogonal to the X-ray incidence plane.

ω scans were performed at 1 mm intervals on a 70 mm long line segment being parallel to the m-axis and passing through an approximate center of the gallium polar surface, and XRC-FWHMs of the (004) reflection were measured. In each of the ω scans, the X-ray incidence plane was kept parallel to the m-axis.

The measured values of XRC-FWHM at all measurement points are listed in Table 1 below. The average value and standard deviation of the XRC-FWHMs across all the measurement points were 11.7 arcsec and 3.8 arcsec, respectively.

TABLE 1

| No. of measurement points | XRC-FWHM (arcsec) |
|---|---|
| 1 | 15.9 |
| 2 | 19.7 |
| 3 | 12.0 |
| 4 | 26.3 |
| 5 | 19.2 |
| 6 | 8.4 |
| 7 | 9.0 |
| 8 | 9.8 |
| 9 | 11.0 |
| 10 | 16.8 |
| 11 | 8.7 |
| 12 | 8.8 |
| 13 | 8.3 |
| 14 | 10.0 |
| 15 | 9.3 |
| 16 | 10.0 |
| 17 | 10.1 |
| 18 | 8.4 |
| 19 | 8.5 |
| 20 | 9.6 |
| 21 | 11.9 |
| 22 | 12.8 |
| 23 | 9.3 |
| 24 | 9.4 |
| 25 | 10.2 |
| 26 | 11.1 |
| 27 | 8.4 |
| 28 | 7.7 |
| 29 | 7.4 |
| 30 | 7.7 |
| 31 | 8.3 |
| 32 | 8.3 |
| 33 | 8.5 |
| 34 | 11.0 |
| 35 | 11.9 |
| 36 | 10.1 |
| 37 | 8.2 |
| 38 | 9.0 |
| 39 | 16.0 |
| 40 | 17.0 |
| 41 | 10.7 |
| 42 | 8.0 |
| 43 | 7.5 |
| 44 | 7.5 |
| 45 | 8.1 |
| 46 | 14.2 |
| 47 | 16.7 |
| 48 | 15.7 |
| 49 | 16.4 |
| 50 | 8.9 |
| 51 | 9.2 |
| 52 | 9.2 |
| 53 | 10.5 |
| 54 | 10.6 |
| 55 | 13.6 |
| 56 | 17.7 |
| 57 | 14.8 |
| 58 | 17.1 |
| 59 | 18.0 |
| 60 | 11.6 |
| 61 | 13.4 |
| 62 | 11.5 |
| 63 | 18.4 |
| 64 | 9.9 |
| 65 | 8.6 |
| 66 | 10.0 |
| 67 | 17.4 |
| 68 | 12.7 |
| 69 | 10.9 |
| 70 | 14.3 |

Further, ω scans were performed at 1 mm intervals on a 59 mm long line segment being parallel to the a-axis and passing through an approximate center of the gallium polar surface, and XRC-FWHMs of the (004) reflection were measured. In each of the ω scans, the X-ray incidence plane was kept parallel to the a-axis.

The measured values of XRC-FWHM at all the measurement points are listed in Table 2 below. The average value and standard deviation of the XRC-FWHMs across all the measurement points were 13.0 arcsec and 4.2 arcsec, respectively.

TABLE 2

| No. of measurement points | XRC-FWHM (arcsec) |
|---|---|
| 1 | 7.9 |
| 2 | 10.4 |
| 3 | 9.2 |
| 4 | 21.5 |
| 5 | 13.6 |
| 6 | 12.3 |
| 7 | 15.4 |
| 8 | 24.3 |
| 9 | 13.2 |
| 10 | 24.2 |
| 11 | 10.2 |
| 12 | 14.0 |
| 13 | 23.2 |
| 14 | 15.0 |
| 15 | 12.1 |
| 16 | 11.5 |
| 17 | 12.7 |
| 18 | 14.5 |
| 19 | 18.9 |
| 20 | 17.1 |
| 21 | 8.3 |
| 22 | 8.1 |
| 23 | 8.0 |
| 24 | 10.0 |
| 25 | 12.0 |
| 26 | 8.4 |
| 27 | 8.1 |
| 28 | 8.0 |
| 29 | 9.2 |
| 30 | 9.7 |
| 31 | 8.9 |
| 32 | 10.6 |
| 33 | 11.0 |
| 34 | 13.6 |
| 35 | 15.7 |
| 36 | 12.1 |
| 37 | 13.5 |
| 38 | 15.4 |
| 39 | 15.9 |
| 40 | 11.3 |
| 41 | 11.2 |
| 42 | 16.4 |
| 43 | 19.2 |
| 44 | 13.5 |
| 45 | 9.7 |
| 46 | 10.9 |
| 47 | 13.1 |
| 48 | 19.0 |
| 49 | 17.3 |
| 50 | 9.2 |
| 51 | 13.6 |
| 52 | 19.8 |
| 53 | 12.3 |
| 54 | 16.5 |
| 55 | 9.6 |
| 56 | 8.8 |
| 57 | 9.4 |
| 58 | 9.0 |
| 59 | 8.0 |

<Impurity Concentration>

Concentrations of fluorine, iodine, and hydrogen from the surface to a depth of 10 μm were measured by SIMS on the gallium polar surface side of the C-plane GaN wafer produced in Experiment 1. The concentrations in a part with a depth of 1 μm or more were less than lower detection limit (the lower detection limit was an order of $10^{14}$ to $10^{15}$ atoms/cm$^3$) for fluorine and iodine and $2\times10^{18}$ atoms/cm$^3$ for hydrogen.

<Infrared Absorption Spectrum>

An infrared absorption spectrum of the C-plane GaN wafer produced in Experiment 1 was measured, and a plurality of absorption peaks attributable to a gallium vacancy-hydrogen complex were observed within a range from 3,100 to 3,500 cm$^{-1}$. The plurality of absorption peaks included four peaks, the peak top wavelengths of which were around 3,150 cm$^{-1}$, around 3,164 cm$^{-1}$, around 3,176 cm$^{-1}$, and around 3,188 cm$^{-1}$.

(6) Evaluation of Ingot

The X-ray diffraction property of the GaN crystal after the regrowth obtained in above 5.1. (3) was evaluated by an X-ray diffractometer [PANalytical X'pert PRO MRD (from Spectris Co., Ltd.)] while the GaN crystal kept bonded to the seed. A Ge (220) 2-crystal monochromator was used in an incident optical system of the X-ray diffraction apparatus.

XRCs were measured at 0.2 mm intervals on a virtual line segment drawn on the as-grown surface (nitrogen polar surface) of the GaN crystal grown on the nitrogen polar surface of the HVPE seed.

The line segment was orthogonal to the stripe direction of the pattern mask formed on the nitrogen polar surface of the HVPE seed, and had a length of 51.4 mm. The X-ray incidence plane in the ω scan at each measurement point was parallel to the line segment.

The FWHMs of XRC measured on the line segment were investigated, and as a result, they were less than 40 arcsec at all the 258 measurement points.

It was at 35 points out of the 258 measurement points where the XRC-FWHMs were 30 arcsec or more, and the XRC-FWHMs fell below 30 arcsec at 223 points corresponding to 86% of all the measurement points.

5.2. Experiment 2

(1) Preparation of Seed

An HVPE seed having the same quality as that used in Experiment 1 was prepared. The HVPE seed prepared in Experiment 2 was a disk-shaped C-plane GaN wafer of 2 inches in diameter.

(2) Formation of Pattern Mask

As in Experiment 1, a 200 nm thick pattern mask made of the laminated film of TiW and Pt was formed on the nitrogen polar surface of the HVPE seed. However, the pattern of the pattern mask was a rhomboid grid type having first linear openings and second linear openings extending in mutually different directions.

The extending direction of the first linear openings was tilted by 12° from one of intersection lines between the M-planes and the nitrogen polar surface in the HVPE seed. The angle formed between the extending direction of the first linear openings and the extending direction of the second linear openings was 60°.

The widths of the first linear openings and the second linear openings were both 50 μm. The pitch between the first linear openings was 4 mm and that between the second linear openings was 12 mm.

(3) Growth of GaN Crystal by Ammonothermal Method

A GaN single crystal was grown by an ammonothermal method on the HVPE seed with the above-described pattern mask formed thereon.

The crystal growth apparatus and the crystal growth conditions were the same as in Experiment 1. However, the growth time was 35 days, and regrowth was not carried out.

The GaN crystal was grown by 2.9 mm in the [000-1] direction in 35 days. Therefore, the growth rate was 82 µm/day. The growth front was flattened, and the coalescence was mostly completed.

An observational result of the wafer obtained by slicing the grown crystal suggested that the coalescence began to occur in the GaN crystal when it was grown by 1 to 1.5 mm in the [000-1] direction.

(4) Processing for Making Wafer

The GaN single crystal grown by the ammonothermal method was sliced in parallel to the C-plane, and both of the main surfaces of resultant blank wafers were lapped and CMP-finished, to yield 350 µm thick C-plane GaN wafers having approximately regular hexagonal main surfaces.

(5) Evaluation of Wafer

XRC-FWHMs of the (002) reflection of the C-plane GaN wafer produced in Experiment 2 were measured using an X-ray diffraction apparatus [PANalytical X'pert PRO MRD from Spectris Co., Ltd.]. A Ge (220) 2-crystal monochromator was used in an incident optical system of the X-ray diffraction apparatus. The beam size of the X-ray on the specimen surface was set so as to be 0.2 mm×3 mm when the incident angle of the X-ray is 90°. At the time of measurement, the direction in which the beam size was 3 mm was kept orthogonal to the X-ray incidence plane.

Figure 17:
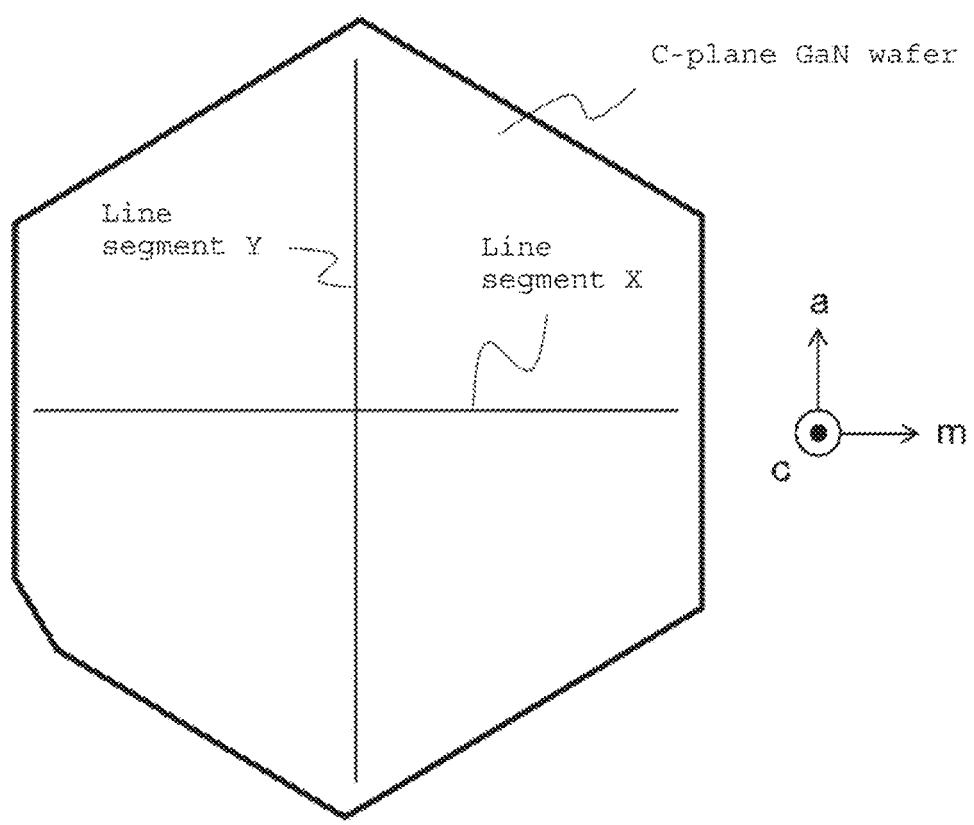
FIG. 17 is a plan view of a C-plane GaN wafer for illustrating measurement directions of XRC-FWHMs.

The measurements were carried out at 0.2 mm intervals on a line segment X parallel to the m-axis and a line segment Y parallel to the a-axis, each of the line segments passing through an approximate center of the gallium polar surface, as illustrated in FIG. 17. As in Experiment 1, the X-ray incidence plane in the ω scan at each measurement point on the line segment X was kept parallel to the line segment X, and the X-ray incidence plane in the ω scan at each measurement point on the line segment Y was kept parallel to the line segment Y.

The length of the line segment X exceeded 90% of the size of the gallium polar surface in the m-axis direction. The length of the line segment Y exceeded 90% of the size of the gallium polar surface in the a-axis direction.

As a result of measurements over 45 mm on the line segment X parallel to the m-axis, the XRC-FWHMs fell below 40 arcsec at all 226 measurement points.

It was at 3 points out of the 226 measurement points where the XRC-FWHMs were 30 arcsec or more, and the XRC-FWHMs fell below 30 arcsec at 223 points corresponding to 99% of all the measurement points.

As a result of measurements over 53.8 mm on the line segment Y parallel to the a-axis, the XRC-FWHMs fell below 40 arcsec at all 270 measurement points.

It was at one point out of 270 measurement points where the XRC-FWHM was 30 arcsec or more, and the XRC-FWHMs fell below 30 arcsec at 269 points corresponding to approximately 100% of all the measurement points.

On the line segment Y, there was a section of 46.6 mm in length where the XRC-FWHMs fell below 30 arcsec at all the measuring points within the section.

A curvature radius of the C-plane in a direction parallel to the line segment X, calculated from a variation rate of peak top angle of the XRCs measured on the line segment X, was 550 m (in this calculation, the variation rate of peak top angle of the XRCs was determined, using a least squares method, from the measured values at all of the 226 measuring points).

Separately from that, two points 10 mm apart from each other were selected from the 226 measurement points on the line segment X, and a curvature radius of the C-plane was calculated from the XRC peak top angle difference Δω between the two points by using the aforementioned formula 1 ($R=\Delta L/\Delta w$). As a result, regardless of the two selected points, the absolute value of the curvature radius of the C-plane in the direction parallel to the line segment X never fell below 78 m. In other words, the absolute value of the curvature radius was 78 m when calculated from the two selected points which yielded the maximum Δw.

A curvature radius of the C-plane in a direction parallel to the line segment Y, calculated from a variation rate of peak top angle of the XRCs measured on the line segment Y, was 79 m (in this calculation, the variation rate of the peak top angle of XRCs was determined, by using the least squares method, from the measured values at all of the 270 measurement points).

Separately from that, two points 10 mm apart from each other were selected from the 270 measurement points on the line segment Y, and a curvature radius of the C-plane was calculated from the XRC peak top angle difference Δω between the two points by using the aforementioned formula 1 ($R=\Delta L/\Delta w$). As a result, regardless of the two selected points, the absolute value of the curvature radius of the C-plane in the direction parallel to the line segment Y never fell below 52 m. In other words, the absolute value of the curvature radius was 52 m when calculated from the two selected points which yielded the maximum Δω.

(6) Evaluation of Ingot

The X-ray diffraction property of the GaN crystal obtained in above 5. 2. (3) was evaluated using an X-ray diffractometer [PANalytical X'pert PRO MRD from Spectris Co., Ltd.] while the GaN crystal was bound to the seed. A Ge (220) 2-crystal monochromator was used in an incident optical system of the X-ray diffraction apparatus.

XRCs were measured at 0.2 mm intervals on a virtual line segment drawn on the as-grown surface (nitrogen polar surface) of the GaN crystal grown on the nitrogen polar surface of the HVPE seed.

The line segment formed an angle of 78° with the extending direction of the first linear openings of the pattern mask formed on the nitrogen polar surface of the HVPE seed and was parallel to one of the m-axes, and the length of the line segment was 41 mm. The X-ray incidence plane in the ω scan at each measurement point was parallel to the line segment.

As a result of investigating the FWHMs of XRC measured on the line segment, they were less than 40 arcsec at all 206 measurement points.

It was at 3 points out of 206 measurement points where the XRC-FWHMs were 30 arcsec or more, and the XRC-FWHMs fell below 30 arcsec at 203 points corresponding to 98% of all the measurement points.

On the line segment, there was a section of 21.6 mm in length where XRC-FWHMs fell below 30 arcsec at all the measurement points within the section.

Although the present invention has been described with reference to specific embodiments, each embodiment was presented as an example and does not limit the scope of the present invention. Each of the embodiments described herein can be variously modified without departing from the spirit of the invention, and can be combined with characteristics described by other embodiments so long as it can be enabled.

REFERENCE SIGNS LIST

10 GaN single crystal
11 gallium polar surface
12 nitrogen polar surface
13 side surface
14 linear dislocation array
15 orientation flat
20 C-plane GaN wafer
21 gallium polar surface
22 nitrogen polar surface
23 side surface
30 pattern mask
31 linear opening
40 GaN crystal
50 void
100 crystal growth apparatus
101 autoclave
102 growth vessel
102a feedstock dissolution zone
102b crystal growth zone
103 baffle
104 platinum wire
105 vacuum pump
106 ammonia cylinder
107 nitrogen cylinder
108 valve
109 mass flow meter

The invention claimed is:

1. A GaN single crystal comprising a gallium polar surface which is a main surface on one side and a nitrogen polar surface which is a main surface on the opposite side,
wherein on the gallium polar surface is found at least one square area, an outer periphery of which is constituted by four sides of 2 mm or more in length, and, when the at least one square area is divided into a plurality of sub-areas each of which is a 100 μm×100 μm square, etch pit-free areas account for 80% or more of the plurality of sub-areas, said etch pit-free areas being areas where EPD is 0 $cm^{-2}$, and
wherein an average value of EPDs across the plurality of sub-areas is less than $1 \times 10^4$ $cm^{-2}$.

2. The GaN single crystal according to claim 1, wherein the etch pit-free areas account for 85% or more of the plurality of sub-areas.

3. The GaN single crystal according to claim 1, wherein the etch pit-free areas account for 90% or more of the plurality of sub-areas.

4. The GaN single crystal according to claim 1, wherein in a sub-area having a highest EPD among the plurality of sub-areas, the EPD is less than $1 \times 10^6$ $cm^{-2}$.

5. The GaN single crystal according to claim 3, wherein in a sub-area having the highest EPD among the plurality of sub-areas, the EPD is less than $2 \times 10^5$ $cm^{-2}$.

6. The GaN single crystal according to claim 3, wherein the average value of EPDs across the plurality of sub-areas is less than $3 \times 10^3$ $cm^{-2}$.

7. The GaN single crystal according to claim 5, wherein the average value of EPDs across the plurality of sub-areas is less than $3 \times 10^3$ $cm^{-2}$.

8. The GaN single crystal according to claim 3, wherein the length of each of the four sides constituting the outer periphery of the at least one square area is 3.5 mm or less.

9. The GaN single crystal according to claim 5, wherein the length of each of the four sides constituting the outer periphery of the at least one square area is 3.5 mm or less.

10. The GaN single crystal according to claim 6, wherein the length of each of the four sides constituting the outer periphery of the at least one square area is 3.5 mm or less.

11. The GaN single crystal according to claim 1, wherein at least one square etch pit-free area of 1.3 mm× 1.3 mm is found on the gallium polar surface.

12. The GaN single crystal according to claim 1, wherein each of the gallium polar surface and the nitrogen polar surface has a size encompassing a 10 mm×10 mm square, and an anomalous transmission image of a square area of 10 mm×10 mm is obtainable from the crystal by X-ray topography.

13. A GaN single crystal having a comprising polar surface which is a main surface on one side and a nitrogen polar surface which is a main surface on the opposite side,
wherein at least one square etch pit-free area of 1.3 mm x 1.3 mm is found on the gallium polar surface, said square etch pit-free area being an area where EPD is 0 $cm^{-2}$, and
wherein on the gallium polar surface is found at least one square area, an outer periphery of which is constituted by four sides of 2 mm or more in length, and, when the at least one square area is divided into a plurality of sub-areas each of which is a 100 μm×100 μm square, an average value of EPDs across the plurality of sub-areas is less than $1 \times 10^4$ $cm^{-2}$.

* * * * *